United States Patent
Kido et al.

(10) Patent No.: US 11,863,892 B2
(45) Date of Patent: Jan. 2, 2024

(54) IMAGING UNIT AND ELECTRONIC APPARATUS WITH FIRST AND SECOND LIGHT BLOCKING FILMS

(71) Applicant: SONY SEMICONDUCTOR SOLUTIONS CORPORATION, Kanagawa (JP)

(72) Inventors: Hideo Kido, Kanagawa (JP); Takashi Machida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 235 days.

(21) Appl. No.: 17/437,545

(22) PCT Filed: Mar. 11, 2020

(86) PCT No.: PCT/JP2020/010510
§ 371 (c)(1),
(2) Date: Sep. 9, 2021

(87) PCT Pub. No.: WO2020/195825
PCT Pub. Date: Oct. 1, 2020

(65) Prior Publication Data
US 2022/0150428 A1    May 12, 2022

(30) Foreign Application Priority Data
Mar. 25, 2019  (JP) .................. 2019-056165

(51) Int. Cl.
| | | |
|---|---|---|
| *H04N 25/704* | (2023.01) | |
| *H01L 27/146* | (2006.01) | |
| *H04N 25/75* | (2023.01) | |

(52) U.S. Cl.
CPC ....... *H04N 25/704* (2023.01); *H01L 27/1461* (2013.01); *H01L 27/14623* (2013.01); *H04N 25/75* (2023.01)

(58) Field of Classification Search
CPC .. H04N 25/704; H04N 25/75; H01L 27/1461; H01L 27/14623
See application file for complete search history.

(56) References Cited

U.S. PATENT DOCUMENTS 9,356,061 B2 * 5/2016 Fan ................. H01L 27/1464
10,879,282 B2 * 12/2020 Ikeda ............... H04N 25/76
(Continued)

FOREIGN PATENT DOCUMENTS

| CN | 105190891 A | 12/2015 |
|---|---|---|
| CN | 105706240 A | 6/2016 |

(Continued)

OTHER PUBLICATIONS

International Search Report and Written Opinion of PCT Application No. PCT/JP2020/010510, dated Jun. 16, 2020, 09 pages of ISRWO.

*Primary Examiner* — Nicholas G Giles
(74) *Attorney, Agent, or Firm* — CHIP LAW GROUP

(57) ABSTRACT

An imaging unit having a superior phase-difference detection characteristic is provided. The imaging unit includes two or more image-plane phase-difference detection pixels each including a semiconductor layer, a photoelectric converter, a charge holding section, a first light-blocking film, and a second light-blocking film. The semiconductor layer includes a front surface and a back surface on an opposite side to the front surface. The photoelectric converter is provided in the semiconductor layer, and is configured to generate electric charge corresponding to a light reception amount by photoelectric conversion. The charge holding section is provided between the front surface and the pho- (Continued)

toelectric converter in the semiconductor layer, and is configured to hold the electric charge. The first light-blocking film is positioned between the photoelectric converter and the charge holding section, and has an opening through which the electric charge is allowed to pass. The second light-blocking film is positioned on an opposite side to the first light-blocking film as viewed from the photoelectric converter. Here, all of the second light-blocking films of the two or more respective image-plane phase-difference detection pixels are provided in respective first regions, or are provided in respective second regions. The first regions each include an overlapping region that is a region overlapping the opening in a pixel region occupied by the photoelectric converter. The second regions are each a region other than the first region in the pixel region.

7 Claims, 17 Drawing Sheets

(56) References Cited

U.S. PATENT DOCUMENTS

| | | |
|---|---|---|
| 2011/0279727 A1 | 11/2011 | Kusaka |
| 2015/0035028 A1* | 2/2015 | Fan .................... H01L 27/14638 257/292 |
| 2015/0084146 A1 | 3/2015 | Kusaka |
| 2016/0027823 A1 | 1/2016 | Kusaka |
| 2016/0343753 A1 | 11/2016 | Asatsuma |
| 2016/0343756 A1 | 11/2016 | Fan et al. |
| 2016/0380016 A1 | 12/2016 | Kusaka |
| 2017/0278890 A1 | 9/2017 | Kusaka |
| 2018/0033809 A1 | 2/2018 | Tayanaka et al. |
| 2018/0366501 A1 | 12/2018 | Asatsuma |
| 2019/0006403 A1* | 1/2019 | Ikeda ..................... H04N 25/75 |
| 2019/0081094 A1 | 3/2019 | Kato et al. |
| 2019/0140009 A1 | 5/2019 | Kusaka |

FOREIGN PATENT DOCUMENTS

| | | |
|---|---|---|
| CN | 107431075 A | 12/2017 |
| CN | 108550599 A | 9/2018 |
| CN | 109155323 A | 1/2019 |
| CN | 109728014 A | 5/2019 |
| EP | 3439038 A1 | 2/2019 |
| JP | 2011-176715 A | 9/2011 |
| JP | 2015-015295 A | 1/2015 |
| JP | 2016-534557 A | 11/2016 |
| KR | 10-2016-0029727 A | 3/2016 |
| KR | 10-2016-0033231 A | 3/2016 |
| KR | 10-2017-0139687 A | 12/2017 |
| TW | 201508905 A | 3/2015 |
| TW | 201515202 A | 4/2015 |
| TW | 201715716 A | 5/2017 |
| WO | 2015/001769 A2 | 1/2015 |
| WO | 2015/020821 A2 | 2/2015 |
| WO | 2016/129406 A1 | 8/2016 |
| WO | 2016/136486 A1 | 9/2016 |
| WO | 2017/169479 A1 | 10/2017 |

* cited by examiner

[FIG. 1A]
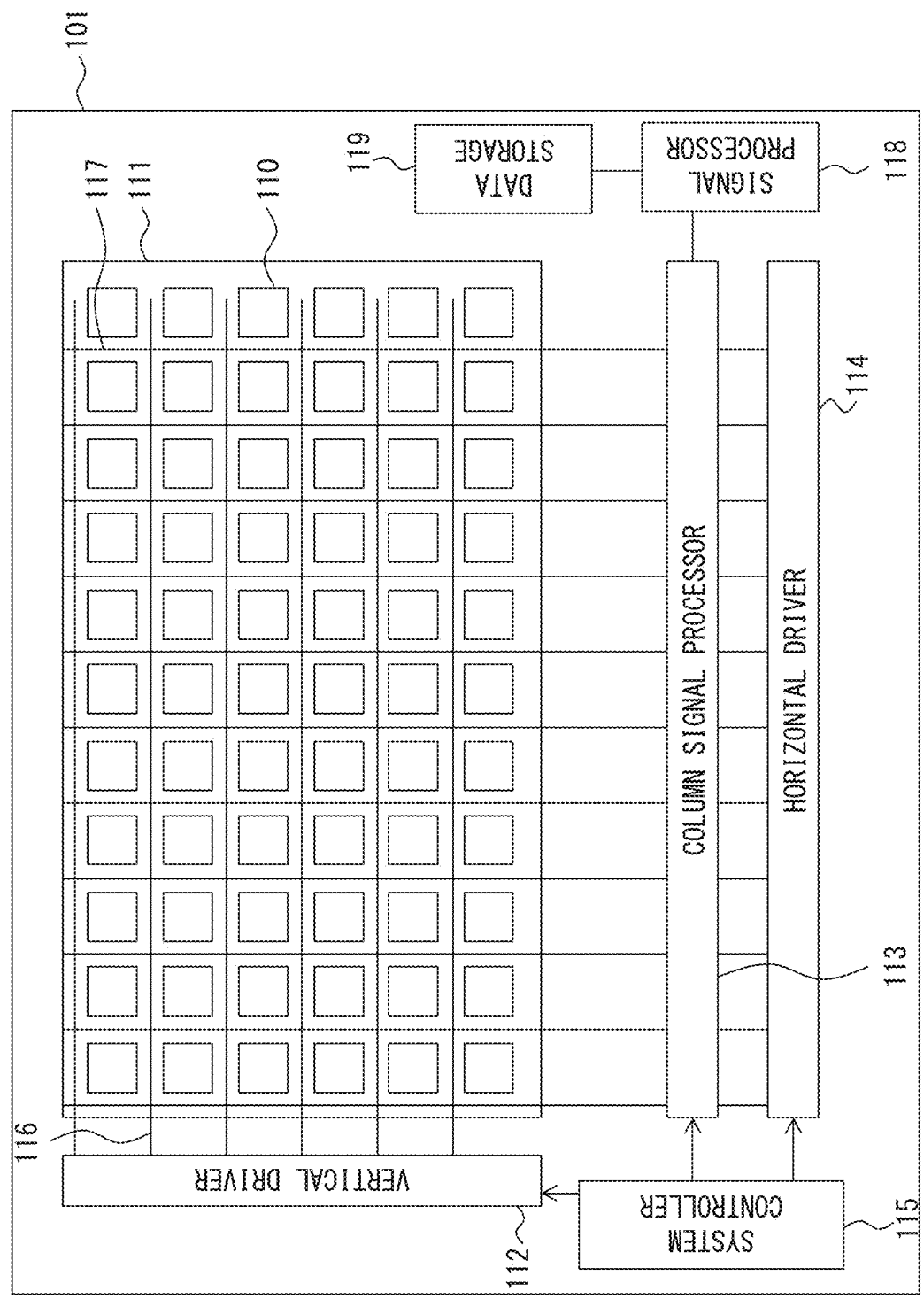

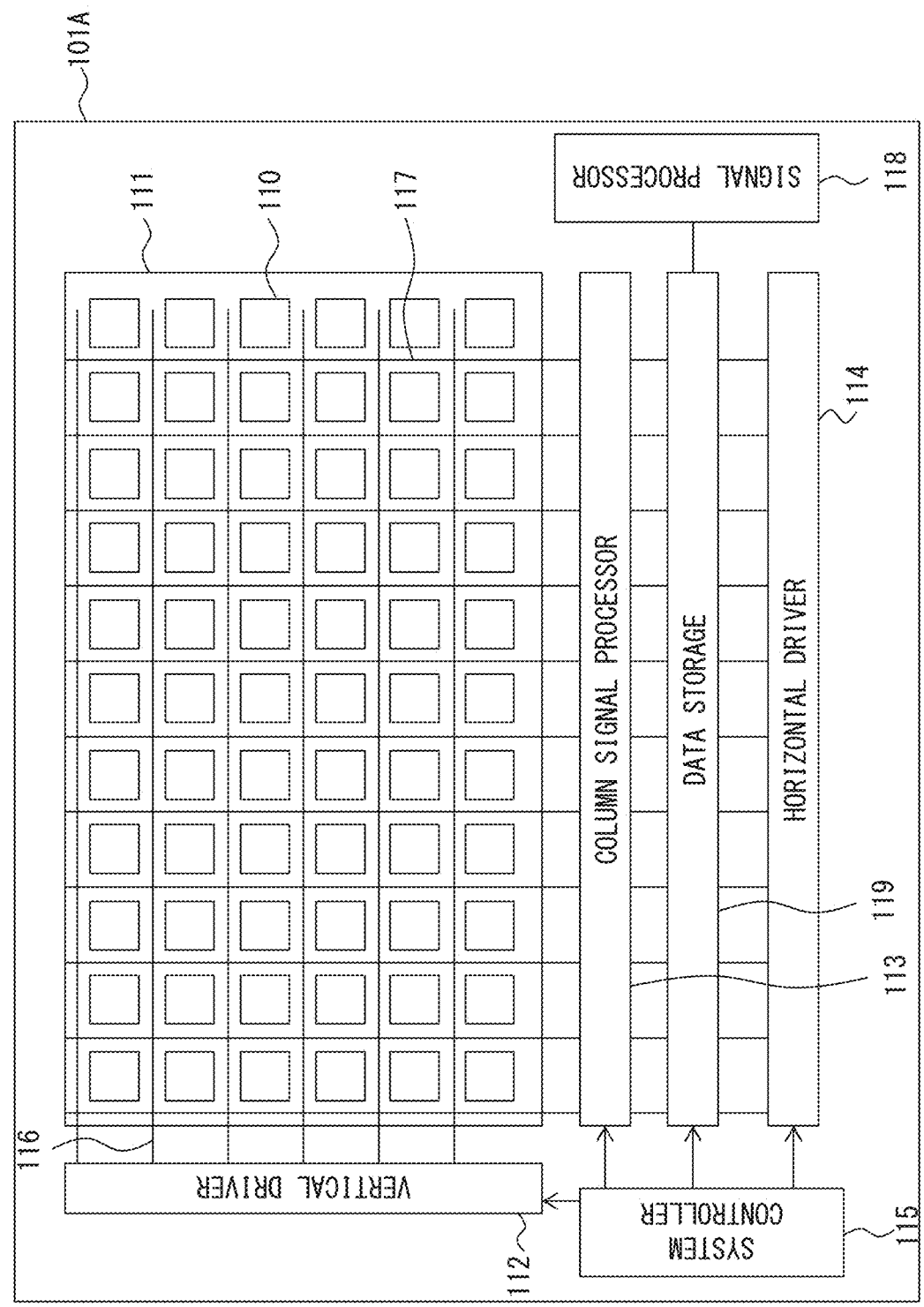
[FIG. 1B]

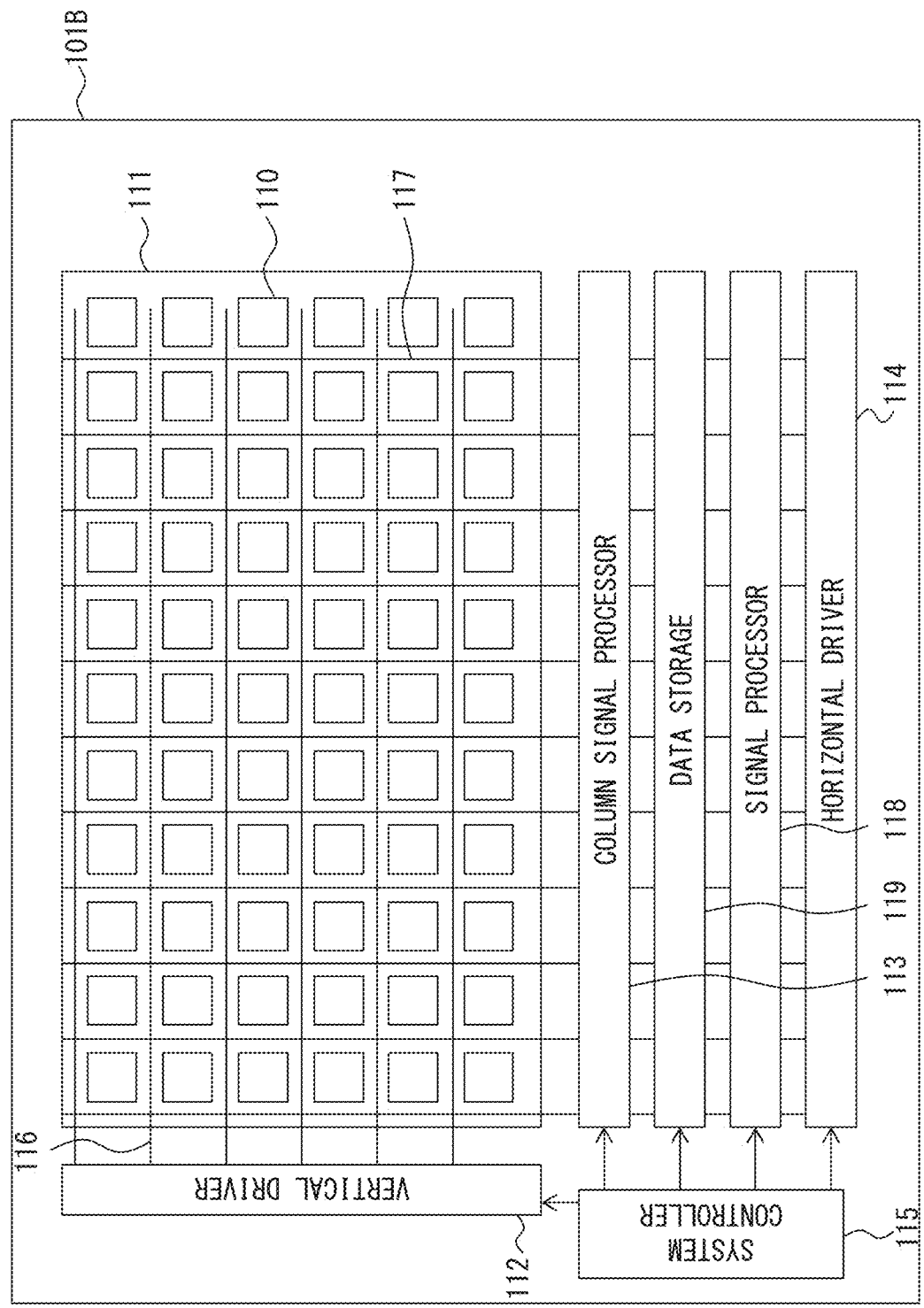
[FIG. 1C]

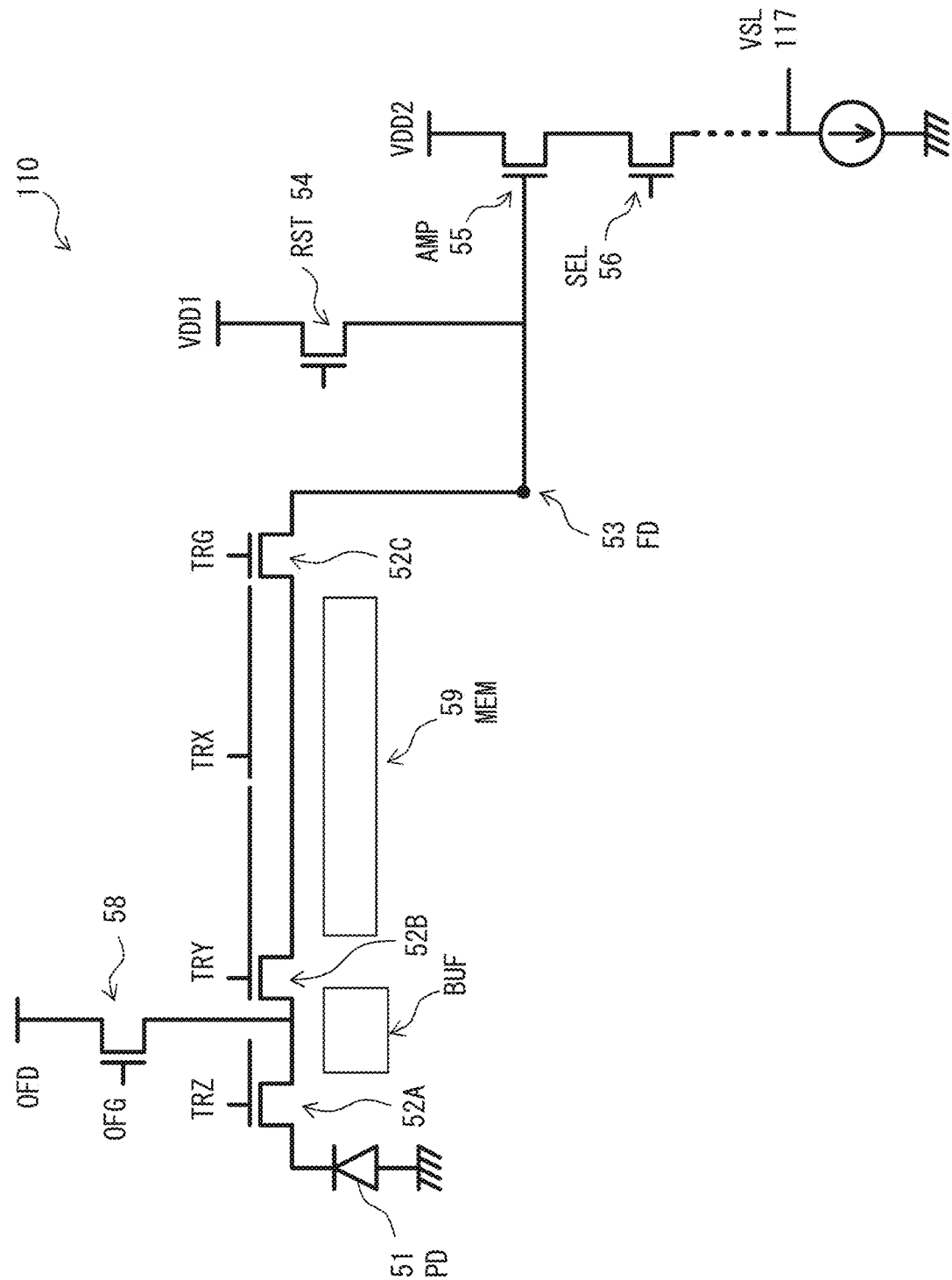
[FIG. 2]

[FIG. 3]
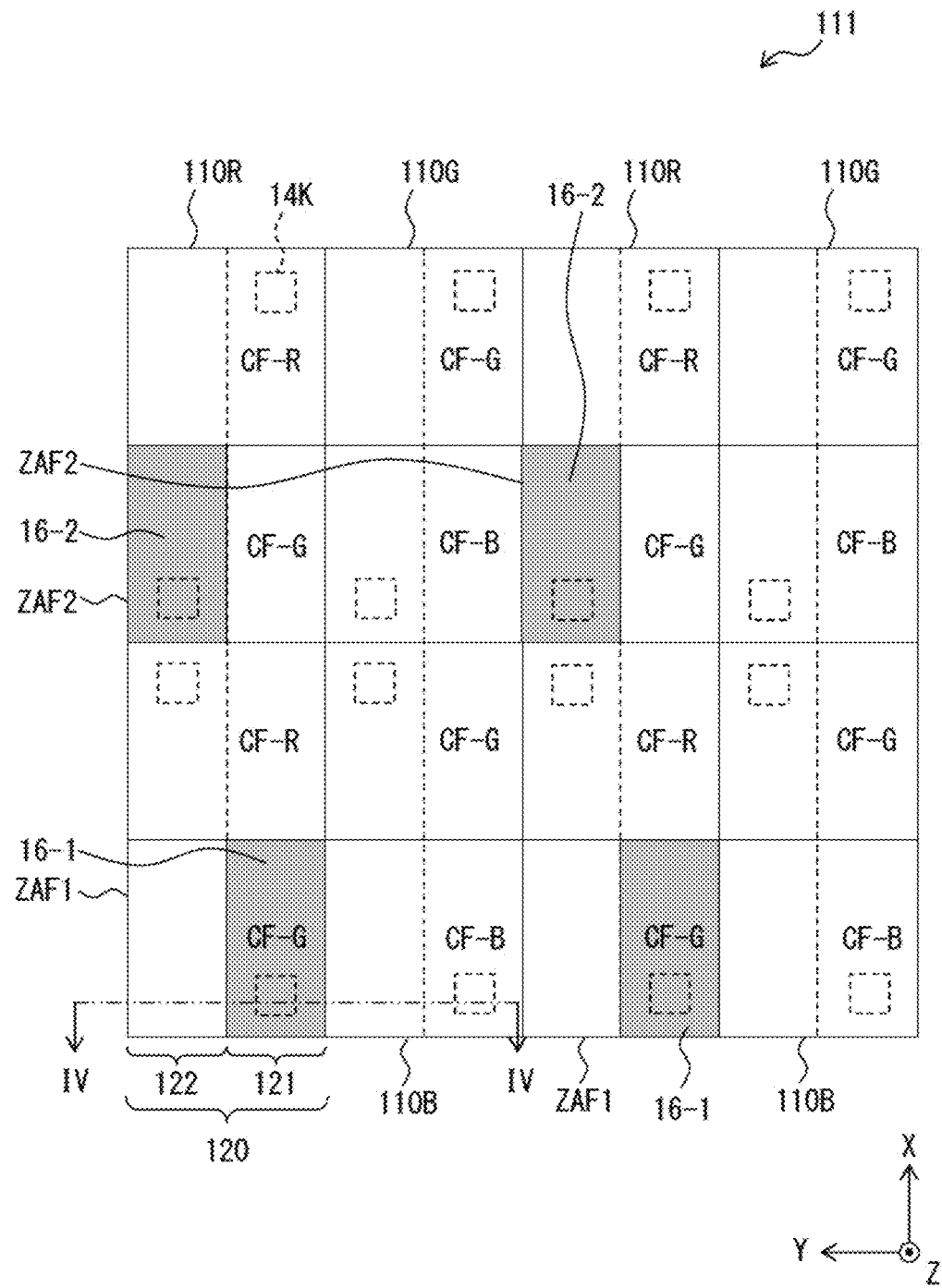

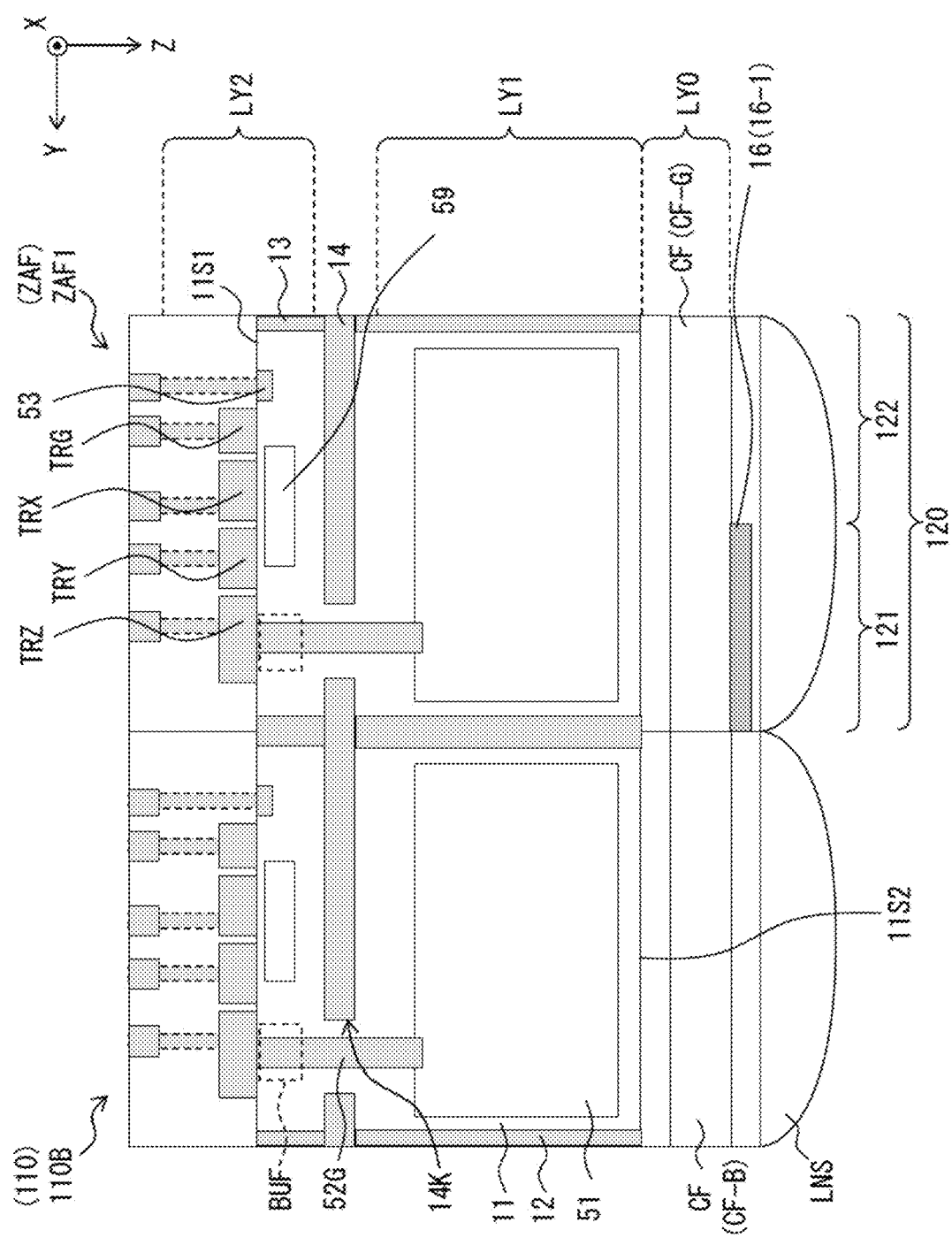
[FIG. 4]

[FIG. 5A]
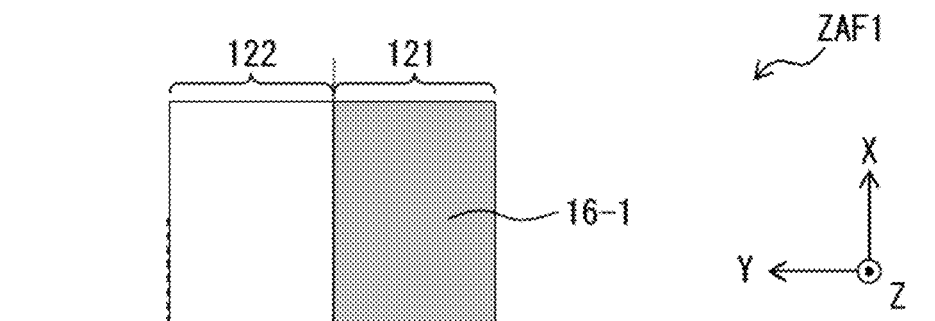
[FIG. 5B]
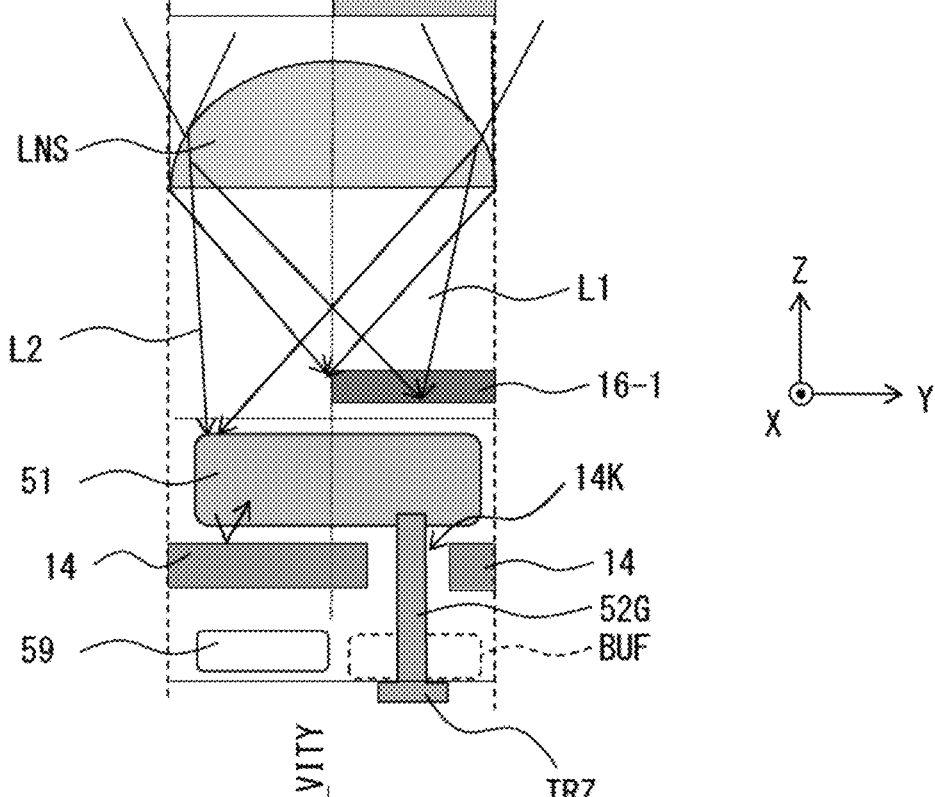
[FIG. 5C]
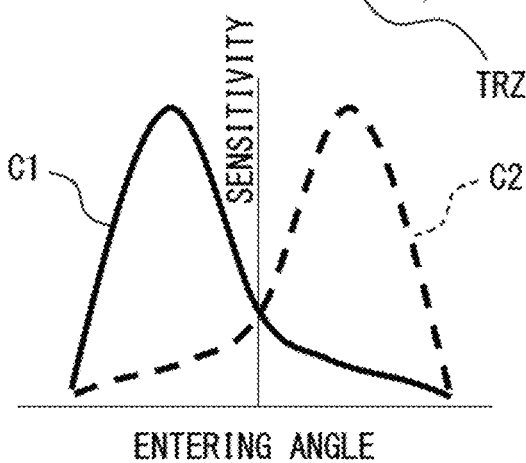

[FIG. 6A]
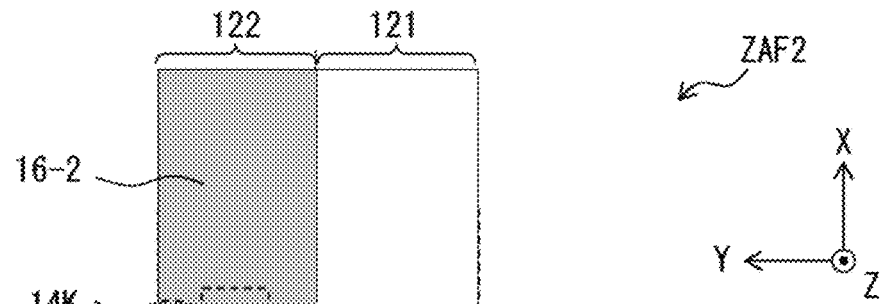
[FIG. 6B]
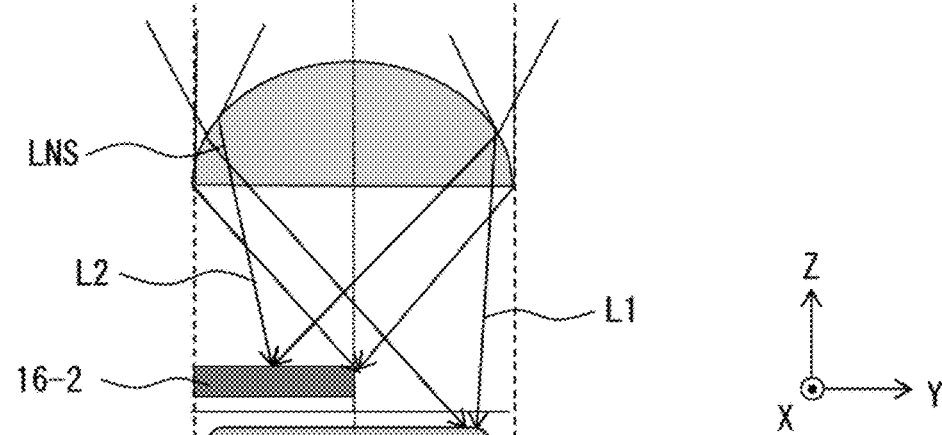
[FIG. 6C]
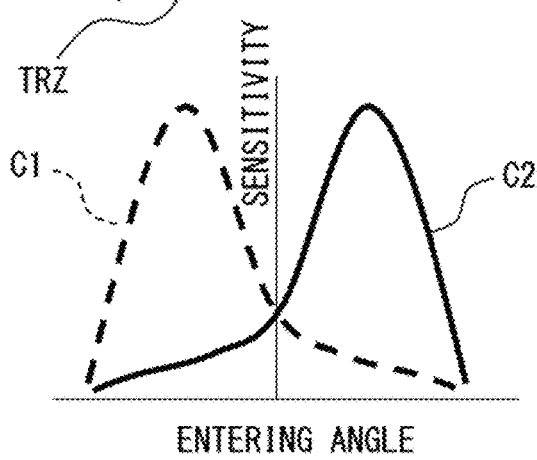

[FIG. 7A]
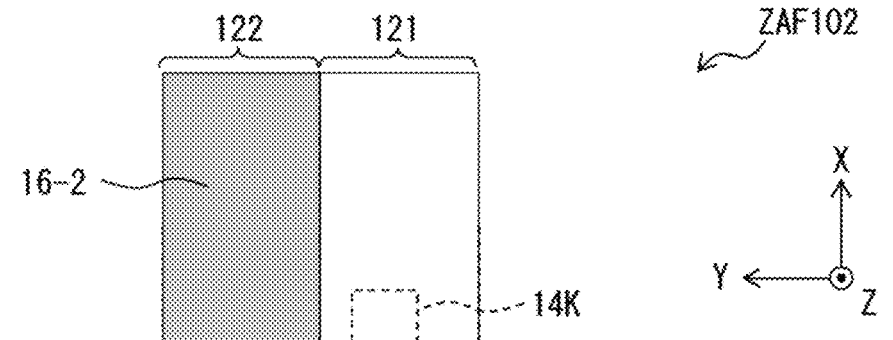
[FIG. 7B]
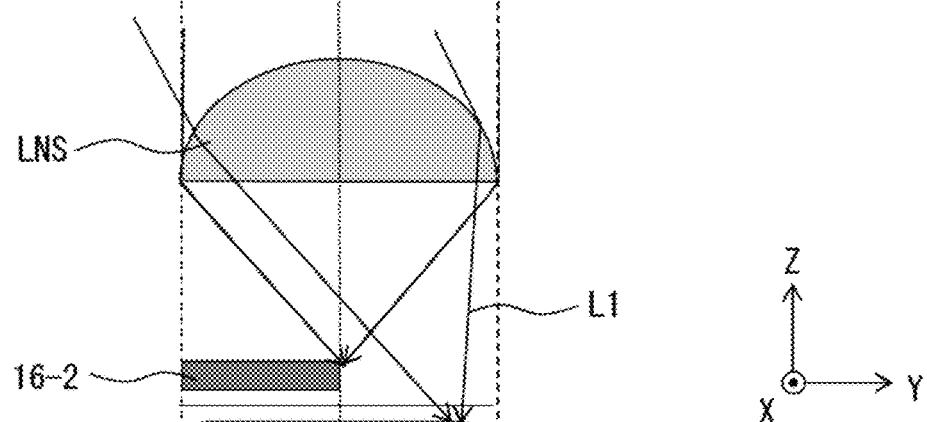
[FIG. 7C]
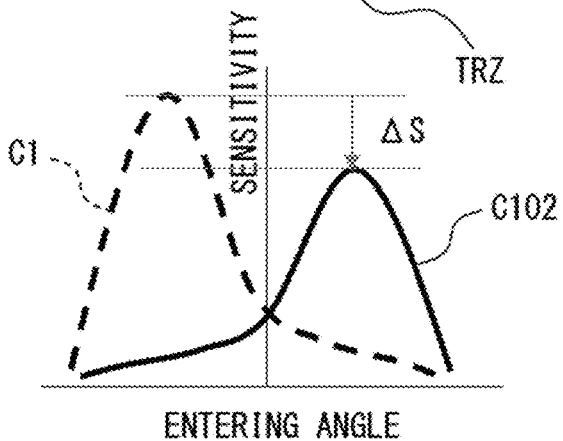

[FIG. 8]
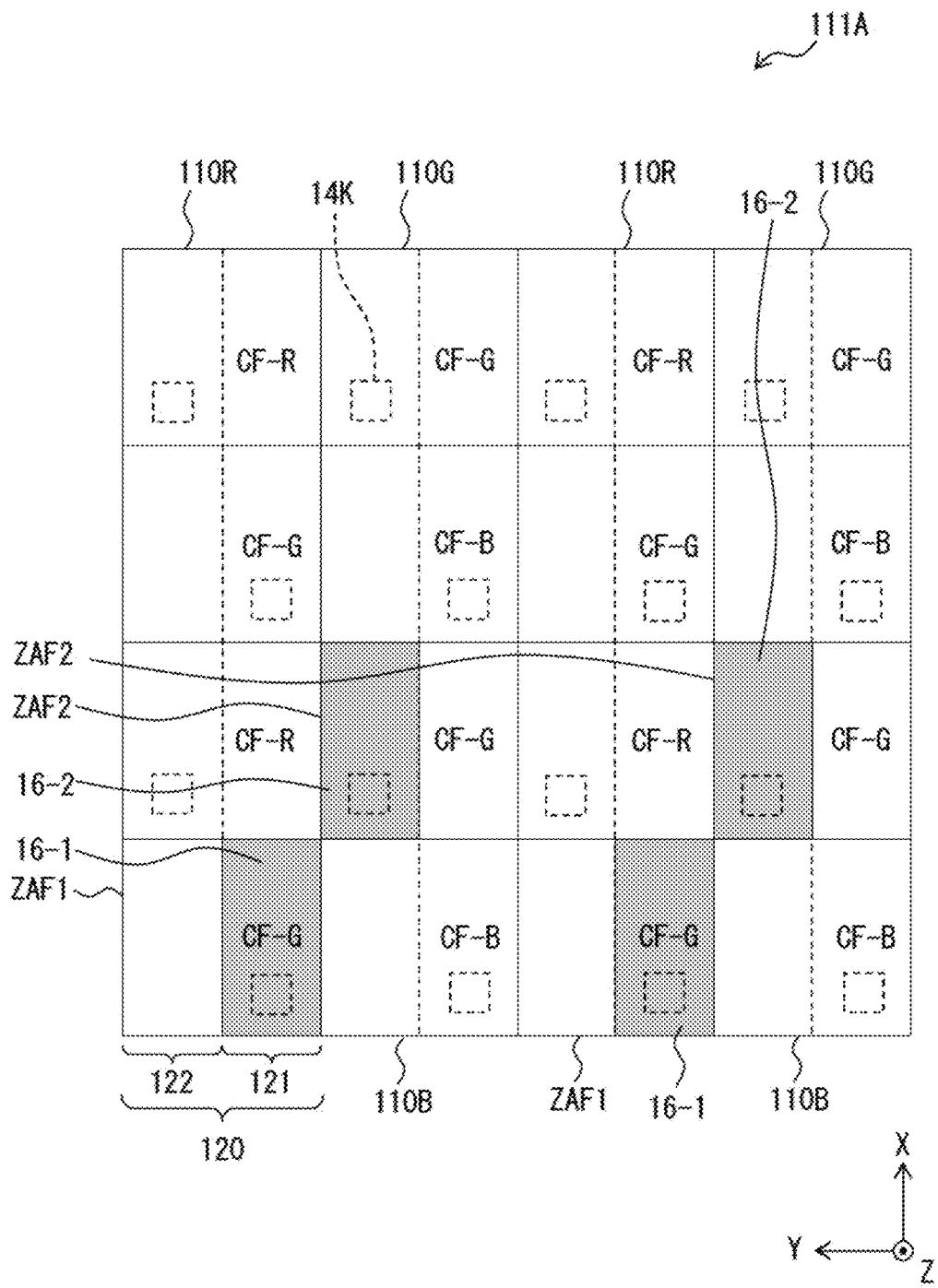

[FIG. 9]
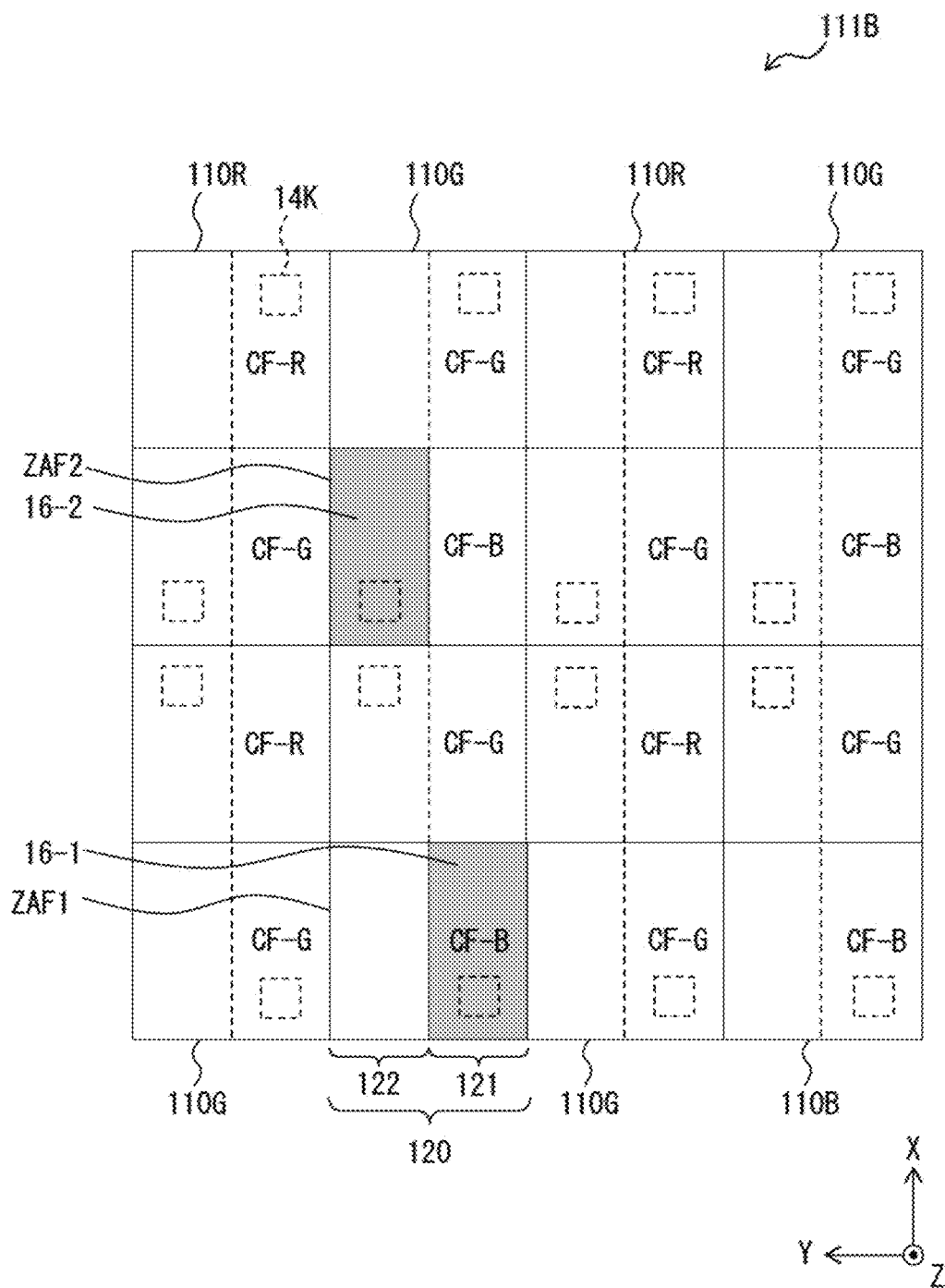

[FIG. 10]
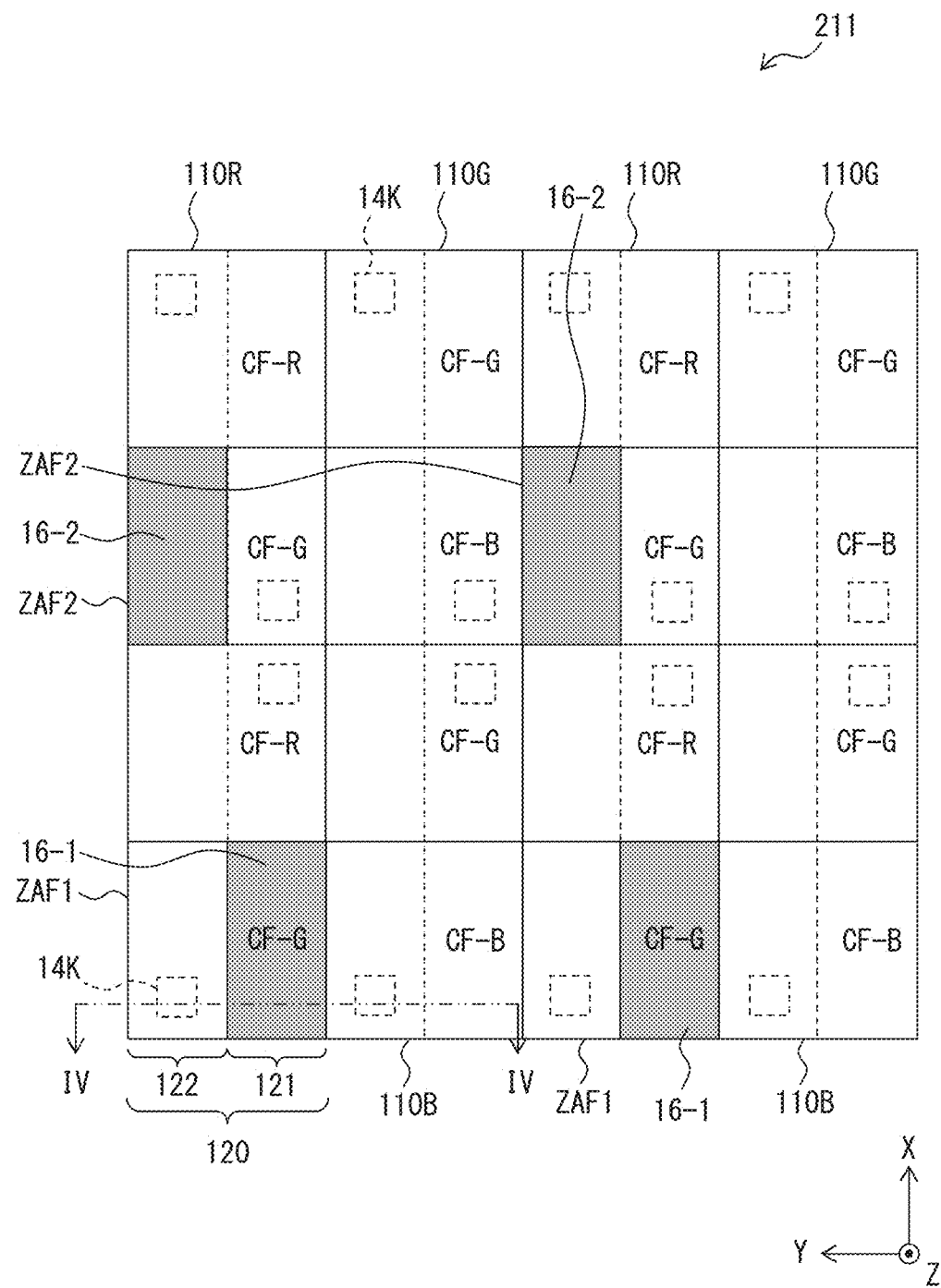

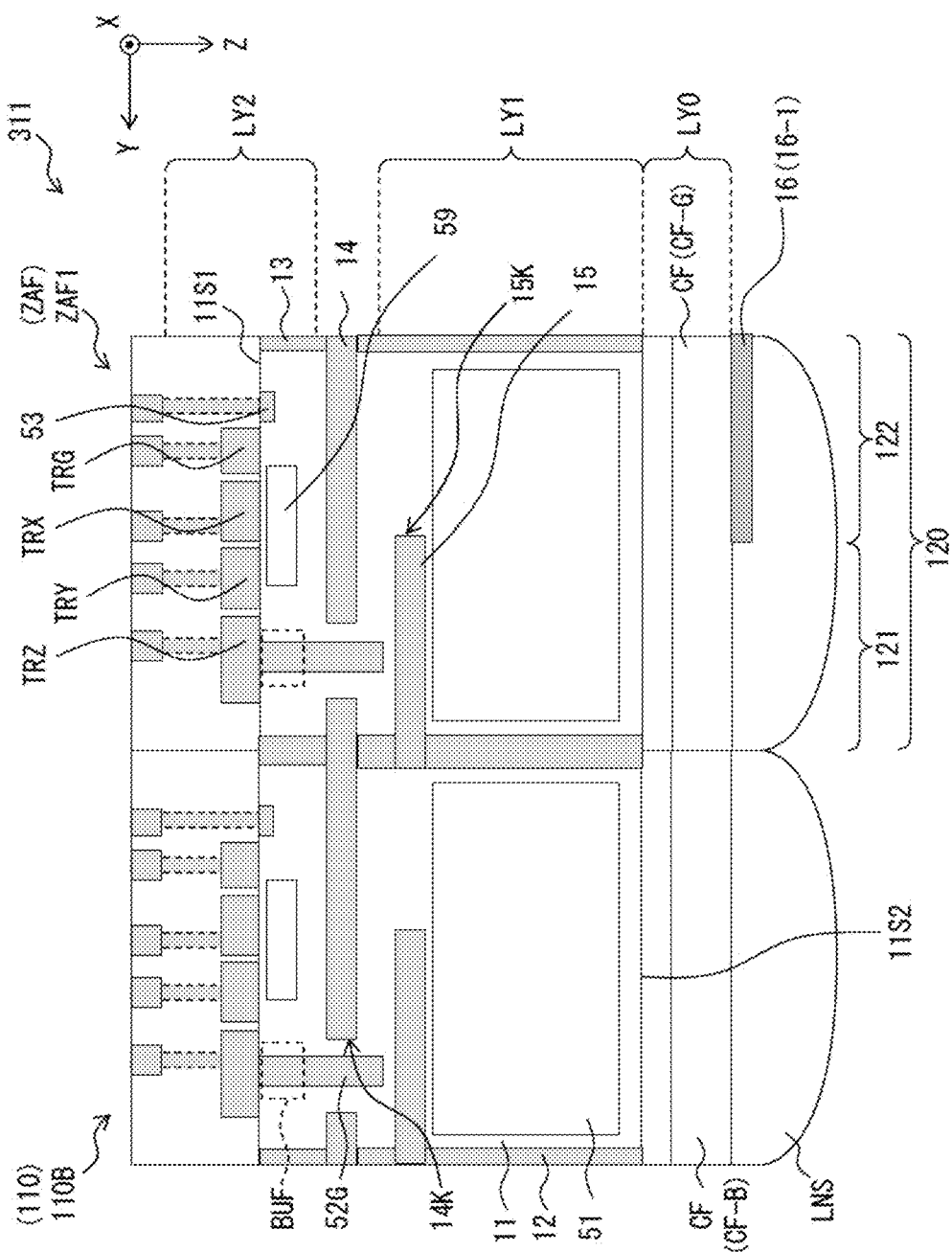
[FIG. 11]

[FIG. 12]
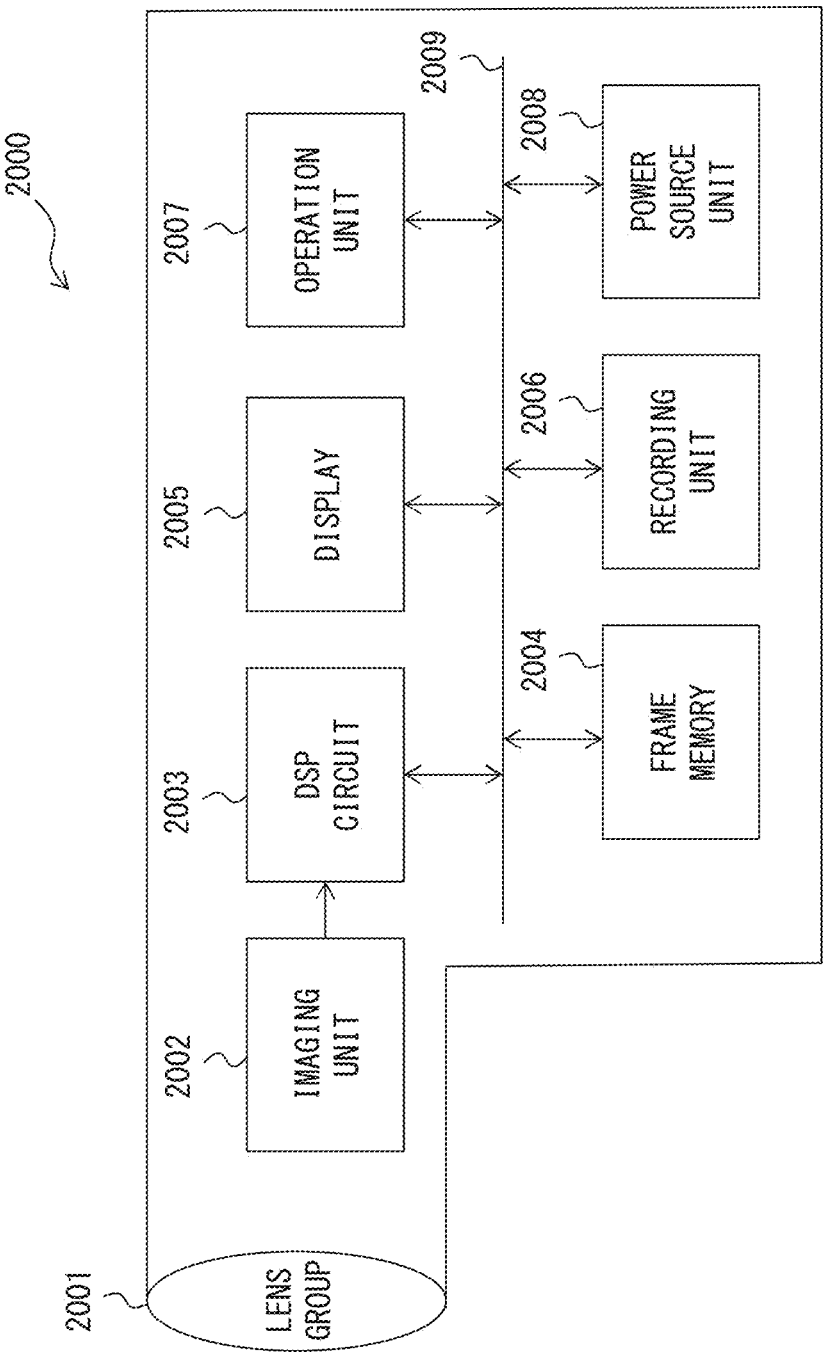

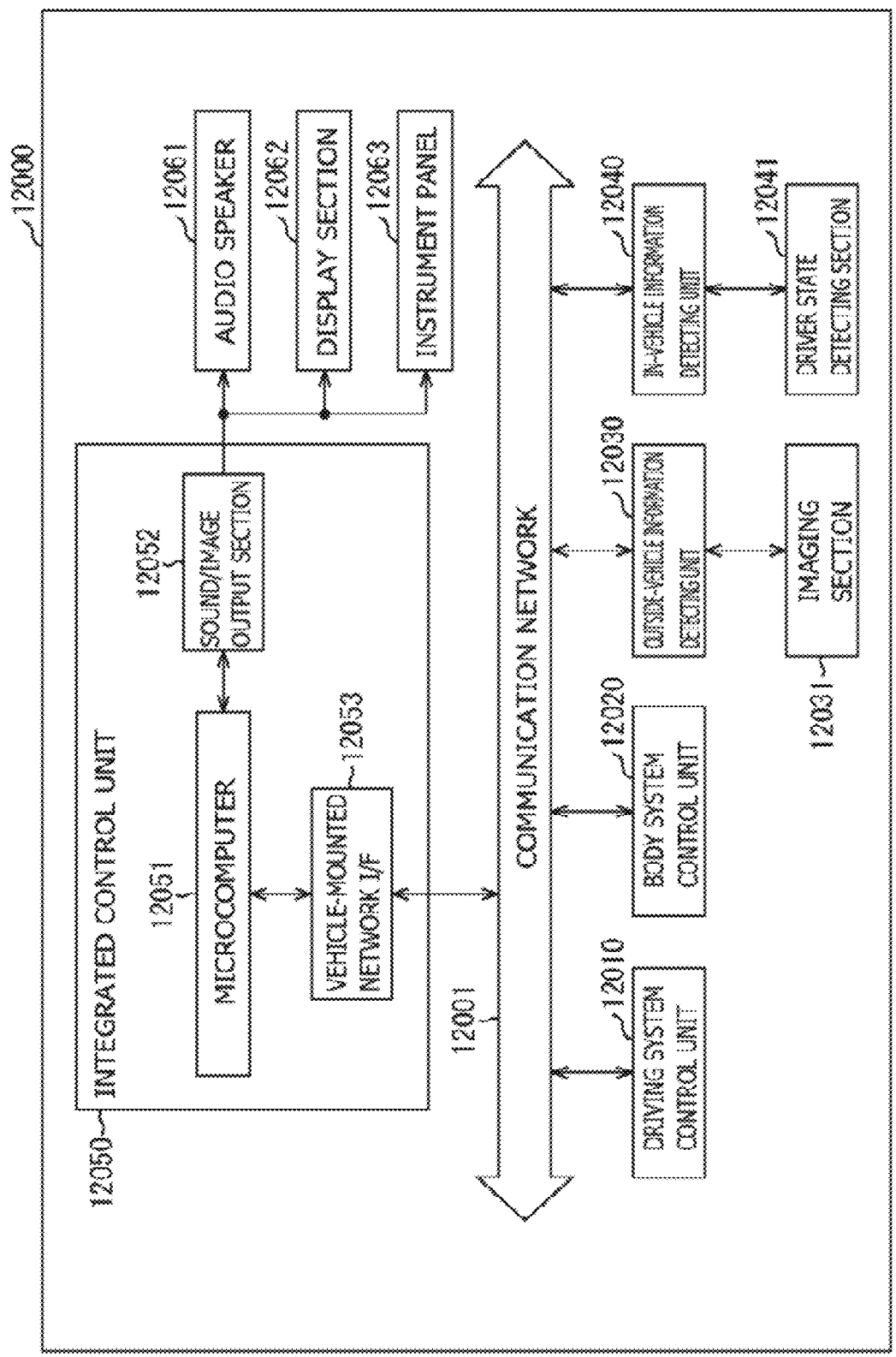
[FIG. 13]

[FIG. 14]
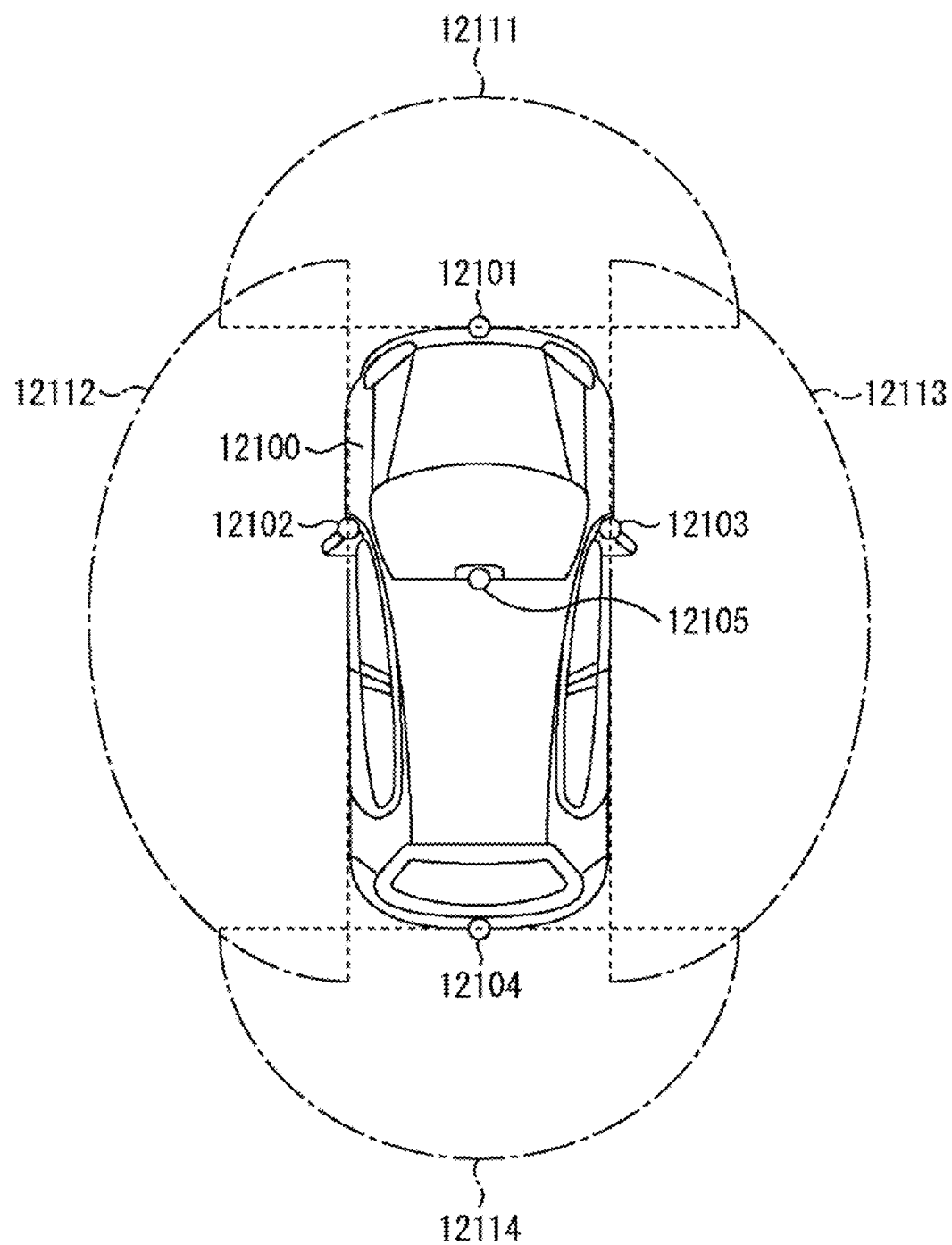

[FIG. 15]
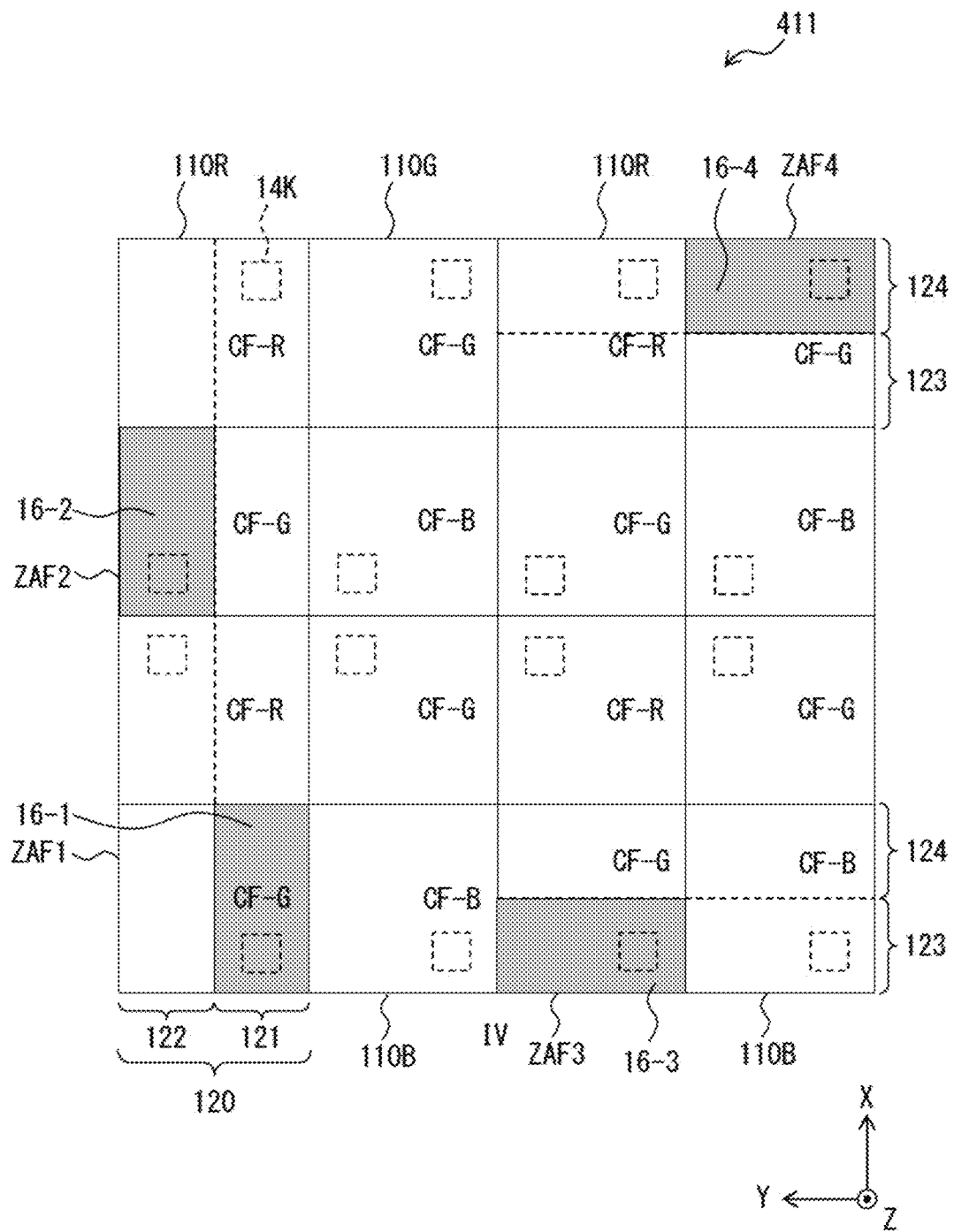

IMAGING UNIT AND ELECTRONIC APPARATUS WITH FIRST AND SECOND LIGHT BLOCKING FILMS

CROSS REFERENCE TO RELATED APPLICATIONS

This application is a U.S. National Phase of International Patent Application No. PCT/JP2020/010510 filed on Mar. 11, 2020, which claims priority benefit of Japanese Patent Application No. JP 2019-056165 filed in the Japan Patent Office on Mar. 25, 2019. Each of the above-referenced applications is hereby incorporated herein by reference in its entirety.

TECHNICAL FIELD

The present disclosure relates to an imaging unit including an image-plane phase-difference detection pixel and an electronic apparatus including the imaging unit.

BACKGROUND ART

So far, there has been proposed an imaging unit that includes an image-plane phase-difference detection pixel for obtaining a phase-difference signal for autofocusing in addition to a normal pixel for obtaining an image signal (for example, see PTL 1).

CITATION LIST

Patent Literature

PTL 1: International Publication No. 2016/129406

SUMMARY OF THE INVENTION

Incidentally, in such an imaging unit, it is desired that variation in detection sensitivity between phase-difference pixels be small.

Therefore, it is desirable to provide an imaging unit having a superior phase-difference detection characteristic and an electronic apparatus including such an imaging unit.

An imaging unit according to an embodiment of the present disclosure includes two or more image-plane phase-difference detection pixels each including a semiconductor layer, a photoelectric converter, a charge holding section, a first light-blocking film, and a second light-blocking film. The semiconductor layer includes a front surface and a back surface on an opposite side to the front surface. The photoelectric converter is provided in the semiconductor layer, and is configured to generate electric charge corresponding to a light reception amount by photoelectric conversion. The charge holding section is provided between the front surface and the photoelectric converter in the semiconductor layer, and is configured to hold the electric charge. The first light-blocking film is positioned between the photoelectric converter and the charge holding section, and has an opening through which the electric charge is allowed to pass. The second light-blocking film is positioned on an opposite side to the first light-blocking film as viewed from the photoelectric converter. Here, all of the second light-blocking films of the two or more respective image-plane phase-difference detection pixels are provided in respective first regions, or are provided in respective second regions. The first regions each include an overlapping region that is a region overlapping the opening in a pixel region occupied by the photoelectric converter. The second regions are each a region other than the first region in the pixel region.

Further, an electronic apparatus according to an embodiment of the present disclosure includes the imaging unit described above.

In the imaging unit and the electronic apparatus each according to the embodiment of the present disclosure, the second light-blocking films of the two or more respective image-plane phase-difference detection pixels are provided only in the first regions, or are provided only in the second regions. Therefore, as compared with a case where an image-plane phase-difference detection pixel having the second light-blocking film in the first region and an image-plane phase-difference detection pixel having the second light-blocking film in the second region are both provided in a mixed manner, variation in detection sensitivity between the two or more image-plane phase-difference detection pixels is reduced.

BRIEF DESCRIPTION OF DRAWINGS

FIG. 1A is a block diagram illustrating an example of a configuration of an imaging unit according to a first embodiment of the present disclosure.

FIG. 1B is a block diagram illustrating an example of a configuration of an imaging unit according to a first modification of the first embodiment.

FIG. 1C is a block diagram illustrating an example of a configuration of an imaging unit according to a second modification of the first embodiment.

FIG. 2 is a circuit diagram illustrating a circuit configuration of a single sensor pixel of the imaging unit illustrated in FIG. 1A.

FIG. 3 is a schematic plan view of an example of an arrangement of sensor pixels in a pixel array section illustrated in FIG. 1A.

FIG. 4 is a schematic cross-sectional view of a configuration of the sensor pixel illustrated in FIG. 3.

FIGS. 5A, 5B, and 5C are explanatory diagrams for explaining phase-difference signal detection sensitivity of a first image-plane phase-difference detection pixel illustrated in FIG. 3.

FIGS. 6A, 6B, and 6C are explanatory diagrams for explaining phase-difference signal detection sensitivity of a second image-plane phase-difference detection pixel illustrated in FIG. 3.

FIGS. 7A, 7B, and 7C are explanatory diagrams for explaining phase-difference signal detection sensitivity of the second image-plane phase-difference detection pixel according to a reference example.

FIG. 8 is a schematic plan view of an arrangement of sensor pixels in a pixel array section according to a third modification of the first embodiment.

FIG. 9 is a schematic plan view of an arrangement of sensor pixels in a pixel array section according to a fourth modification of the first embodiment.

FIG. 10 is a schematic plan view of an arrangement of sensor pixels in a pixel array section according to a second embodiment of the present disclosure.

FIG. 11 is a schematic cross-sectional view of a configuration of a sensor pixel in a pixel array section according to a third embodiment of the present disclosure.

FIG. 12 is a schematic diagram illustrating an example of an overall configuration of an electronic apparatus.

FIG. 13 is a block diagram depicting an example of schematic configuration of a vehicle control system.

FIG. 14 is a diagram of assistance in explaining an example of installation positions of an outside-vehicle information detecting section and an imaging section.

FIG. 15 is a schematic plan view of an example of an arrangement of sensor pixels in a pixel array section according to another modification of the present disclosure.

MODES FOR CARRYING OUT THE INVENTION

The following describes embodiments of the present disclosure in detail with reference to the drawings. It is to be noted that the description is given in the following order.
1. First Embodiment
   An example of an imaging unit including an image-plane phase-difference detection pixel that includes a second light-blocking film provided in a first region including an overlapping region overlapping an opening of a first light-blocking film.
2. Modifications of First Embodiment
3. Second Embodiment
   An example of an imaging unit including an image-plane phase-difference detection pixel that includes a second light-blocking film provided in a second region including no overlapping region overlapping the opening of the first light-blocking film.
4. Third Embodiment
   An example of an imaging unit further including a third light-blocking film.
5. Example of Application to Electronic Apparatus
6. Example of Application to Mobile Body
7. Other Modifications

1. First Embodiment

[Configuration of Solid-State Imaging Unit 101]

FIG. 1A is a block diagram illustrating an example of a configuration of a solid-state imaging unit 101 according to a first embodiment of the present technology.

The solid-state imaging unit 101 is, for example, a so-called back-illuminated image sensor of a global shutter mode such as a CMOS (Complementary Metal Oxide Semiconductor) image sensor. The solid-state imaging unit 101 receives light from a subject, performs photoelectric conversion on the light, and generates an image signal to perform imaging of an image.

The global shutter mode is a mode in which global exposure is performed, i.e., exposure is basically started at the same time for all pixels and is ended at the same time for all the pixels. Here, the all pixels refer to all of the pixels in a portion appearing in the image, and dummy pixels and the like are excluded. Further, if a time difference or image distortion is small enough not to pose an issue, a mode of moving a region to perform the global exposure while performing the global exposure not at the same time for all the pixels but on the basis of a unit of two or more rows (e.g., several tens of rows) is also included in the global shutter mode. In addition, a mode of performing the global exposure for pixels in a predetermined region, rather than all of the pixels in the portion appearing in the image is also included in the global shutter mode.

The back-illuminated image sensor refers to an image sensor having a configuration in which a photoelectric converter is provided between a light receiving surface into which light from a subject enters and a wiring layer provided with a wiring line of a transistor or the like that drives each pixel. The photoelectric converter is, for example, a photodiode that receives the light from the subject and converts the light into an electric signal.

The solid-state imaging unit 101 includes, for example, a pixel array section 111, a vertical driver 112, a column signal processor 113, a data storage 119, a horizontal driver 114, a system controller 115, and a signal processor 118.

In the solid-state imaging unit 101, the pixel array section 111 is provided on a semiconductor substrate 11 (which will be described later). Peripheral circuits including, for example, the vertical driver 112, the column signal processor 113, the data storage 119, the horizontal driver 114, the system controller 115, and the signal processor 118 are provided on the semiconductor substrate 11 which is the same as that for the pixel array section 111, for example.

The pixel array section 111 includes two or more sensor pixels 110 each including a photoelectric converter 51 (which will be described later) that generates electric charge corresponding to an amount of light entering from the subject and accumulates the electric charge. As illustrated in FIG. 1, the sensor pixels 110 are arranged in each of a horizontal direction (a row direction) and a vertical direction (a column direction). In the pixel array section 111, a pixel drive line 116 is wired in the row direction for each pixel row including sensor pixels 110 arranged in line in the row direction, and a vertical signal line (VSL) 117 is wired in the column direction for each pixel column including sensor pixels 110 arranged in line in the column direction.

The vertical driver 112 includes a shift register, an address decoder, and the like. The vertical driver 112 simultaneously drives all of the two or more sensor pixels 110 in the pixel array section 111 or drives them on a pixel-row-unit basis by supplying signals or the like to the two or more sensor pixels 110 via the two or more respective pixel drive lines 116.

The vertical driver 112 includes, for example, two scanning systems, i.e., a readout scanning system and a sweep scanning system. The readout scanning system sequentially selects and scans the unit pixels in the pixel array section 111 on a row-unit basis in order to read out signals from the unit pixels. The sweep scanning system performs, on a readout row on which readout scanning is to be performed by the readout scanning system, sweep scanning in advance of the readout scanning by a time corresponding to a shutter speed.

As a result of this sweep scanning performed by the sweep scanning system, unnecessary electric charge is swept out from the photoelectric converter 51 of the unit pixels of the readout row. This is called reset. Then, by means of the sweeping out of the unnecessary electric charge by the sweeping scanning system, i.e., resetting, so-called electronic shutter operation is performed. Here, the electronic shutter operation refers to operation of discharging optical charge of the photoelectric converter 51 and newly starting exposure, that is, newly starting accumulation of the optical charge.

A signal to be read out by readout operation by the readout scanning system corresponds to an amount of light that has entered after the readout operation or the electronic shutter operation performed immediately before. An accumulation time of the optical charge in the unit pixel, i.e., an exposure time, is a period from a timing of the reading out of the readout operation performed immediately before or a timing of the sweeping out of the electronic shutter operation performed immediately before to a timing of the reading out of the current readout operation.

The signal to be outputted from each unit pixel in the pixel row selected and scanned by the vertical driver 112 is supplied to the column signal processor 113 through one of the vertical signal lines 117. The column signal processor 113 performs a predetermined signal process on the signal outputted from each unit pixel in the selected row through the vertical signal line 117 for each pixel column of the pixel array section 111, and temporarily holds the pixel signal that has been subjected to the signal process.

Specifically, the column signal processor 113 includes, for example, a shift register, an address decoder, and the like and performs a noise removal process, a correlation double sampling process, an A/D (Analog/Digital) conversion A/D conversion process on an analog pixel signal, and the like to generate a digital pixel signal. The column signal processor 113 supplies the generated pixel signal to the signal processor 118.

The horizontal driver 114 includes a shift register, an address decoder, and the like, and sequentially selects unit circuits corresponding to the pixel columns of the column signal processor 113. By means of the selection scanning by the horizontal driver 114, the pixel signals that have been subjected to the signal process on a unit-circuit basis by the column signal processor 113 are sequentially outputted to the signal processor 118.

The system controller 115 includes a timing generator or the like that generates various timing signals. The system controller 115 performs drive controls of the vertical driver 112, the column signal processor 113, and the horizontal driver 114 on the basis of the timing signals generated by the timing generator.

The signal processor 118 performs, while temporarily storing data in the data storage 119 on an as-needed basis, a signal process such as an arithmetic process on the pixel signals supplied from the column signal processor 113, and outputs an image signal including each of the pixel signals.

The data storage 119 temporarily holds data necessary for the signal process when the signal process is to be performed by the signal processor 118.

It is to be noted that the solid-state imaging unit according to the present technology is not limited to the solid-state imaging unit 101 illustrated in FIG. 1A, and may have a configuration such as a solid-state imaging unit 101A illustrated in FIG. 1B or a solid-state imaging unit 101B illustrated in FIG. 1C, for example. FIG. 1B is a block diagram illustrating an example of a configuration of functions of the solid-state imaging unit 101A according to a first modification of the first embodiment of the present technology. FIG. 1C is a block diagram illustrating an example of a configuration of functions of the solid-state imaging unit 101B according to a second modification of the first embodiment of the present technology.

In the solid-state imaging unit 101A illustrated in FIG. 1B, the data storage 119 is disposed between the column signal processor 113 and the horizontal driver 114, and the pixel signal outputted from the column signal processor 113 is supplied to the signal processor 118 via the data storage 119.

Further, the solid-state imaging unit 101B illustrated in FIG. 1C includes the data storage 119 and the signal processor 118 disposed in parallel between the column signal processor 113 and the horizontal driver 114. In the solid-state imaging unit 101C, the column signal processor 113 performs A/D conversion for each column of the pixel array section 111 or for every two or more columns of the pixel array section 111. The A/D conversion converts an analog pixel signal into a digital pixel signal.

[Configuration of Sensor Pixel 110]
(Example of Circuit Configuration)

Next, referring to FIG. 2, an example of a circuit configuration of the sensor pixel 110 provided in the pixel array section 111 illustrated in FIG. 1A is described. FIG. 2 illustrates an example of a circuit configuration of a single sensor pixel 110 of the two or more sensor pixels 110 included in the pixel array section 111.

In the example illustrated in FIG. 2, the sensor pixels 110 in the pixel array section 111 provide a memory-holding global shutter.

The sensor pixel 110 includes power sources VDD1 and VDD2, a photoelectric converter (PD) 51, first to third transfer transistors (TRs) 52A to 52C, a charge-voltage converter (FD) 53, a reset transistor (RST) 54, an amplifier transistor (AMP) 55, a select transistor (SEL) 56, a discharge transistor (OFG) 58, a charge holding section (MEM) 59, a discharge section OFD, and a buffer BUF. The TR 52A includes a transfer gate TRZ. The TR 52B includes a transfer gate TRY and a transfer gate TRX. The TR 52C includes a transfer gate TRG.

In this example, the TRs 52A to 52C, the RST 54, the AMP 55, the SEL 56, and the OFG 58 are each an N-type MOS transistor. Each of the gate electrodes of the TGs 52A to 52C, the RST 54, the AMP 55, the SEL 56, and the OFG 58 receives a drive signal from the vertical driver 112 and the horizontal driver 114 on the basis of the drive control by the system controller 115. The drive signal is a pulse signal whose high level state corresponds to an active state (an ON state) and whose low level state corresponds to an inactive state (an OFF state). It is to be noted that, hereinafter, bringing the drive signal into the active state is also referred to as turning on the drive signal, and bringing the drive signal into the inactive state is also referred to as turning off the drive signal.

The PD 51 is, for example, a photoelectric conversion element including a photodiode of a PN-junction. The PD 51 is configured to receive light from a subject, generate electric charge corresponding to the amount of received light by photoelectric conversion, and accumulate the electric charge.

The MEM 59 is provided between the PD 51 and the FD 53. The MEM 59 is a region to temporarily hold electric charge in a period from generation and accumulation of electric charge in the PD 51 to transfer of the electric charge to the FD 53 in order to achieve the global shutter function.

The TGs 52A to 52C are disposed between the PD 51 and the FD 53. The TR 52A is configured to transfer the electric charge accumulated in the PD 51 to the MEM 59 in accordance with a drive signal applied to the transfer gate TRZ. The TR 52A is one specific example corresponding to a "charge transfer section" of the present disclosure.

The TR 52B and the TR 52C are configured to transfer the electric charge temporarily held by the MEM 59 to the FD 53 in accordance with the drive signals applied to the transfer gates TRY and TRX and the transfer gate TRG, respectively.

In the sensor pixel 110, for example, the electric charge held by the MEM 59 is transferred to the FD 53 when the TR 52A is turned off and the TR 52B and the TR 52C are turned on.

The buffer BUF is a charge accumulation region provided between the TR 52A and the TR 52B.

The RST 54 includes a drain coupled to the power source VDD1 and a source coupled to the FD 53. The RST 54 initializes, i.e., resets the FD 53 in accordance with the drive signal applied to the gate electrode thereof. For example, when the RST 54 is turned on by the drive signal, a potential of the FD 53 is reset to a voltage level of the power source VDD1. That is, the FD 53 is initialized.

The FD 53 is a floating diffusion region that converts the electric charge transferred from the PD 51 via the TR 52A to the TR 52C and the MEM 59 into an electric signal (e.g., a voltage signal) and outputs the electric signal. The RST 54 is coupled to the FD 53, and the VSL 117 is also coupled to the FD 53 via the amplifier transistor AMP 55 and the SEL 56.

The AMP 55 outputs an electric signal corresponding to the potential of the FD 53. The AMP 55 provides, for example, a source follower circuit together with a constant current source provided in the column signal processor 113. The SEL 56 is configured to be turned on when the sensor pixel 110 is selected, and output an electric signal supplied from the FD 53 via the AMP 55 to the column signal processor 113 via the VSL 117.

The sensor pixels 110 each further include the discharge section OFD in addition to the FD 53 as a transfer destination of electric charge of the PD 51. The OFG 58 is disposed between the TR 52A and the TR 52B.

The OFG 58 includes a drain coupled to the discharge section OFD and a source coupled to a wiring line connecting the TR 52A and the TR 52B. The OFG 58 initializes, i.e., resets, the PD 51 in accordance with a drive signal applied to the gate electrode. To reset the PD 51 means to deplete the PD 51.

Further, each of the OFGs 58 provides an overflow path, and is configured to discharge electric charge overflowing from the PD 51 to the discharge section OFD. Thus, in the sensor pixel 110 of the present embodiment, the OFG 58 is able to directly reset the PD 51.

(Example of Plan Configuration and Example of Cross-Sectional Configuration)

Next, referring to FIGS. 3 and 4, a description is given of an example of a plan configuration and an example of a cross-sectional configuration of the sensor pixels 110 provided in the pixel array section 111 in FIG. 1A. FIG. 3 illustrates an example of a plan configuration of the sensor pixels 110 of a portion (sixteen in the example in FIG. 3) of the plurality of sensor pixels 110 included in the pixel array section 111. Further, FIG. 4 illustrates an example of a cross-sectional configuration of the plurality of sensor pixels 110 included in the pixel array section 111 in an arrow direction along a line IV-IV illustrated in FIG. 3.

In FIG. 3, each of the sixteen square regions sectioned by solid lines represents a pixel region 120 of a single sensor pixel 110. Each pixel region 120 is provided with a rectangular opening 14K (which will be described later) indicated by a broken line. Furthermore, as illustrated in FIG. 3, the sensor pixel 110 includes some first image-plane phase-difference detection pixels ZAF1 and some second image-plane phase-difference detection pixels ZAF2 for obtaining a phase difference signal for autofocusing in addition to image detection pixels 110R, 110G, and 110B for normal image detection.

Further, symbols CF-R, CF-G, and CF-B described in FIG. 3 represent a red color filter CF (which will be described later), a green color filter CF, and a blue color filter CF, respectively. The image detection pixel 110R includes the color filter CF-R, and detects red light from entering light. The image detection pixel 110G includes the color filter CF-G, and detects green light from entering light. The image detection pixel 110B includes the color filter CF-B, and detects blue light from entering light.

As illustrated in FIG. 4, the image detection pixel 110B has a stacked structure in which a first level layer LY1 including the PD 51 and the like and a second level layer LY2 including the MEM 59 and the like are stacked in a Z-axis direction.

The image detection pixel 110B includes, in the first level layer LY1, the semiconductor substrate 11 including a semiconductor material such as Si (silicon) and the PD 51 embedded in the semiconductor substrate 11. The PD 51 is provided in such a manner as to occupy most of the pixel region of the image detection pixel 110B in an XY-plane. As illustrated in FIG. 4, the semiconductor substrate 11 includes a front surface 11S1 and a back surface 11S2 on an opposite side to the front surface 11S1 in the Z-axis direction. The back surface 11S2 is a surface which light from outside enters, and on which a color-filter formation layer LY0 including the color filter CF is provided. An on-chip lens LNS is further provided on the opposite side to the back surface 11S2 of the color filter CF.

The first level layer LY1 of the semiconductor substrate 11 is further provided with a device separator 12 surrounding the PD 51. The device separator 12 is a wall-shaped member extending in the Z-axis direction at a border position between sensor pixels 110 adjacent to each other and surrounding each PD 51. The device separator 12 electrically separates the sensor pixels 110 adjacent to each other. Further, the device separator 12 prevents generation of noise such as color mixing caused by entry of leakage light from the adjacent sensor pixel 110 into the PD 51. The device separator 12 includes, for example, an insulating material such as a silicon oxide.

The second level layer LY2 is provided with pixel transistors including, for example, the TRs 52A to 52C, the FD 53, and the like in addition to the MEM 59. The second level layer LY2 may be provided with the RST 54, the AMP 55, the SEL 56, the OFG 58, and the like. It is to be noted that the MEM 59 is positioned below the transfer gates TRY, TRX, and TRG of the TRs 52B and 52C, for example. The second level layer LY2 is further provided with a vertical trench gate 52G extending in a depth direction (+Z direction) from a lower part of the transfer gate TRZ provided on the front surface 11S1. The vertical trench gate 52G has a tip reaching the PD 51. The vertical trench gate 52G is included as a portion of the "electric charge transfer section". The vertical trench gate 52G couples the PD 51 and the transfer gate TRZ, and serves as a path for transferring the electric charge from the PD 51 to the MEM 59 which is the transfer destination via the buffer BUF. It is to be noted that the vertical trench gates may be disposed in such a manner that two or more vertical trench gates are adjacent to each other in a single sensor pixel 110.

It is preferable that the second level layer LY2 further include a light-blocking wall 13 extending in the Z-axis direction. The MEM 59 is disposed in such a manner as to be sandwiched between two light-blocking walls 13. The light-blocking wall 13 is a member that prevents entry of light into the MEM 59.

An MEM light-blocking film 14 is provided between the PD 51 and the MEM 59 (FIG. 4). The MEM light-blocking film 14 extends along the XY plane. As with the light-blocking wall 13, the MEM light-blocking film 14 is a member that prevents entry of light into the MEM 59, and suppresses generation of noise caused by entry of light passing through the PD 51 into the MEM 59. It is to be noted that light that enters from the back surface 11S2 and passes through the PD 51 without being absorbed by the PD 51 is reflected by the MEM light-blocking film 14, and enters the PD 51 again. That is, the MEM light-blocking film 14 is also a reflector, and enhances photoelectric conversion efficiency by causing the light passing through the PD 51 to enter the PD 51 again. It is to be noted that the MEM light-blocking film 14 is provided with an opening 14K through which electric charge generated by the PD 51 is allowed to pass. The vertical trench gate 52G is provided in such a manner as to run through the opening 14K. It is preferable that the MEM light-blocking film 14 be provided over the entire XY plane of the pixel array section 111 except for the opening 14K. Further, the MEM light-blocking film 14 may be coupled to the light-blocking wall 13.

Further, the opening 14K is provided at a position other than the center in the pixel region 120. As described above, the MEM light-blocking film 14 is also a reflector that reflects passing light from the PD 51 and causes the light to enter the PD 51 again. Therefore, by providing the opening 14K while avoiding the vicinity of the center of the pixel region 120 having highest intensity of light collected by the on-chip lens LNS, it is possible to suppress decrease in the amount of light reflected by the MEM light-blocking film 14.

Here, the MEM light-blocking film 14 is one specific example corresponding to a "first light-blocking film" of the present disclosure, and the opening 14K is one specific example corresponding to an "opening" of the present disclosure.

The MEM light-blocking film 14 and the light-blocking wall 13 each have, for example, a bi-layer structure including an inner-layer portion and an outer-layer portion surrounding the periphery thereof. The inner-layer portion includes, for example, a material including at least one of simple metal, a metal alloy, a metal nitride, or a metal silicide having light-blocking property. More specifically, as the materials included in the inner-layer portion, Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), a tungsten silicon compound, and the like can be mentioned. Among them, Al (aluminum) is the most optically preferable material. It is to be noted that the inner-layer portion may include graphite, an organic material, or the like. The outer-layer portion includes an insulating material, for example, SiOx (a silicon oxide) or the like. The outer-layer portion ensures electrical isolation between the inner-layer portion and the semiconductor substrate 11.

Further, in the present embodiment, the semiconductor substrate 11 is, for example, of a P-type (a first conductivity type), and the PD 51 and the MEM 59 are of an N-type (a second conductivity type).

The image detection pixel 110R and the image detection pixel 110G each have substantially the same configuration as the image detection pixel 110B except that the color of the color filter CF is different.

In the example of the plan configuration of the sensor pixels 110 illustrated in FIG. 3, the image detection pixels 110R, 110G, and 110B provide a so-called Bayer arrangement (Bayer arrangement) in the XY plane. Specifically, first rows and second rows are alternately arranged in an X-axis direction. In each of the first rows, the image detection pixels 110R and the image detection pixels 110G are disposed alternately in a Y-axis direction which is the row direction. In each of the second rows, the image detection pixels 110G and the image detection pixels 110B are disposed alternately also in the Y-axis direction. In other words, first columns and second columns are disposed alternately in the Y-axis direction. In each of the first columns, the image detection pixels 110R and the image detection pixels 110G are disposed alternately in the X-axis direction which is the column direction. In each of the second columns, the image detection pixels 110G and the image detection pixels 110B are disposed alternately also in the X-axis direction.

However, in the pixel array section 111, the first image-plane phase-difference detection pixels ZAF1 and the second image-plane phase-difference detection pixels ZAF2 are disposed among the image detection pixels 110R, 110G, and 110B arranged in each of the X-axis direction and the Y-axis direction. Specifically, in the example of the plan configuration of the sensor pixels 110 illustrated in FIG. 3, the first image-plane phase-difference detection pixels ZAF1 and the second image-plane phase-difference detection pixels ZAF2 are disposed at several positions at which the image detection pixels 110G are to be disposed.

The pixel region 120 of the first image-plane phase-difference detection pixel ZAF1 and the pixel region 120 of the second image-plane phase-difference detection pixel ZAF2 each include a first sub-pixel region 121 and a second sub-pixel region 122 that are adjacent to each other in the Y-axis direction in a divided manner. Further, the first image-plane phase-difference detection pixel ZAF1 includes a ZAF light-blocking film 16-1 provided in the first sub-pixel region 121, and the second image-plane phase-difference detection pixel ZAF2 includes a ZAF light-blocking film 16-2 provided in the second sub-pixel region 122. Here, the ZAF light-blocking film 16 (16-1 or 16-2) is one specific example corresponding to a "second light-blocking film" of the present disclosure.

The first sub-pixel region 121 provided with the ZAF light-blocking film 16-1 in the first image-plane phase-difference detection pixel ZAF1 includes an overlapping region overlapping the opening 14K in the pixel region 120. Further, the second sub-pixel region 122 provided with the ZAF light-blocking film 16-2 in the second image-plane phase-difference detection pixel ZAF2 includes an overlapping region overlapping the opening 14K in the pixel region 120. That is, in the present embodiment, each of the ZAF light-blocking film 16-1 and the ZAF light-blocking film 16-2 overlaps the opening 14K in the Z-axis direction.

As illustrated in FIG. 4, the first image-plane phase-difference detection pixel ZAF1 has substantially the same configuration as the image detection pixels 110R, 110G, and 110B except that the first image-plane phase-difference detection pixel ZAF1 further includes the ZAF light-blocking film 16-1. Further, the first image-plane phase-difference detection pixel ZAF1 and the second image-plane phase-difference detection pixel ZAF2 have substantially the same configuration except that the ZAF light-blocking film 16-1 and the ZAF light-blocking film 16-2 are disposed at different positions.

(Operation of Sensor Pixel 110)

Next, referring to FIGS. 2 to 4 and the like, operation of the sensor pixel 110 is described. In the sensor pixel 110, first, a high-level drive signal is supplied to each of the OFG 58 and the transfer gate TRZ before exposure is performed on the basis of a drive control by the system controller 115. The OFG 58 and the transfer gate TRZ are turned on thereby. As a result, the electric charge accumulated in the PD 51 is discharged to the discharge section OFD, and the PD 51 is reset.

After the PD 51 is reset, a low-level drive signal is supplied to each of the OFG 58 and the transfer gate TRZ on the basis of the drive control by the system controller 115. The OFG 58 and the transfer gate TRZ are turned off thereby. As a result, exposure is started for all of the sensor pixels 110 in the pixel array section 111, and electric charge is generated and accumulated at each PD 51 that has received light from the subject.

After a scheduled exposure time elapses, in all of the sensor pixels 110 in the pixel array section 111, the drive signals to the transfer gate TRZ and the transfer gate TRY are turned on the basis of the drive control by the system controller 115. As a result, in each of the sensor pixels 110, the electric charge accumulated in the PD 51 is transferred from the PD 51 to the MEM 59 via the transfer gate TRZ and the transfer gate TRY, and is temporarily held in the MEM 59.

Thereafter, the drive signals to the transfer gate TRZ and the transfer gate TRY are turned off on the basis of the drive control by the system controller 115. Thereafter, readout operation of sequentially reading out electric charge held in the MEMs 59 of the respective sensor pixels 110 is performed. The read out operation for the electric charge is performed, for example, on a row-unit basis of the pixel array section 111. Specifically, the transfer gate TRX and the transfer gate TRG are turned on by the drive signals for each row to be read out. Thus, the electric charge held in the MEMs 59 of the respective sensor pixels 110 is transferred to the respective FDs 53 on a row-unit basis.

Thereafter, when the SEL 56 is turned on by the drive signal, an electric signal indicating a level corresponding to the electric charge held in the FD 53 is supplied to the column signal processor 113 via the VSL 117 after sequentially passing through the AMP 55 and the SEL 56.

Here, referring to FIGS. 5A, 5B, 5C, 6A, 6B, and 6C, sensitivity with respect to entering light of the first image-plane phase-difference detection pixel ZAF1 is compared with sensitivity with respect to entering light of the second image-plane phase-difference detection pixel ZAF2.

FIGS. 5A, 5B, and 5C illustrate a state in which entering light passes through the on-chip lens LNS and enters the PD 51 in the first image-plane phase-difference detection pixel ZAF1. FIG. 5A is a schematic plan view of the first image-plane phase-difference detection pixel ZAF1 along the XY plane, and FIG. 5B is a schematic cross-sectional view of the first image-plane phase-difference detection pixel ZAF1 along a YZ plane. In the first image-plane phase-difference detection pixel ZAF1, the ZAF light-blocking film 16-1 is provided in the first sub-pixel region 121. Therefore, entering light L1 entering the first sub-pixel region 121 is blocked by the ZAF light-blocking film 16-1 and does not enter the PD 51. Accordingly, only entering light L2 entering the second sub-pixel region 122 enters the PD 51. Further, the opening 14K is not present in the second sub-pixel region 122 of the first image-plane phase-difference detection pixel ZAF1. Therefore, the entering light L2 passing through the PD 51 is reflected by the MEM light-blocking film 14 and enters the PD 51 again. As a result, in the first image-plane phase-difference detection pixel ZAF1, the second sub-pixel region 122 has high sensitivity as indicated by a curve C1 in FIG. 5C. It is to be noted that the curve C1 in FIG. 5C represents a sensitivity distribution of the PD 51 of the first image-plane phase-difference detection pixel ZAF1 with respect to an angle of entering light.

FIGS. 6A, 6B, and 6C illustrate a state in which entering light passes through the on-chip lens LNS and enters the PD 51 in the second image-plane phase-difference detection pixel ZAF2. FIG. 6A is a schematic plan view of the second image-plane phase-difference detection pixel ZAF2 along the XY plane, and FIG. 6B is a schematic cross-sectional view of the second image-plane phase-difference detection pixel ZAF2 along the YZ plane. In the second image-plane phase-difference detection pixel ZAF2, the ZAF light-blocking film 16-2 is provided in the second sub-pixel region 122. Therefore, the entering light L2 entering the second sub-pixel region 122 is blocked by the ZAF light-blocking film 16-2 and does not enter the PD 51. Accordingly, only the entering light L1 entering the first sub-pixel region 121 enters the PD 51. Further, the opening 14K is not present in the first sub-pixel region 121 of the second image-plane phase-difference detection pixel ZAF2. Therefore, the entering light L1 passing through the PD 51 is reflected by the MEM light-blocking film 14 and enters the PD 51 again. As a result, in the second image-plane phase-difference detection pixel ZAF2, the first sub-pixel region 121 has high sensitivity as indicated by a curve C2 in FIG. 6C. It is to be noted that the curve C2 in FIG. 6C represents a sensitivity distribution of the PD 51 of the second image-plane phase-difference detection pixel ZAF2 with respect to an angle of entering light.

As in FIGS. 5C and 6C, with the first image-plane phase-difference detection pixel ZAF1 and the second image-plane phase-difference detection pixel ZAF2 of the present embodiment, phase difference sensitivity symmetrical about the entering angle is obtainable.

In contrast, for example, in a case where the opening 14K is present in the first sub-pixel region 121 which is not shielded by the ZAF light-blocking film 16-2 as in the second image-plane phase-difference detection pixel ZAF102 according to a reference example illustrated in FIGS. 7A and 7B, a portion of the entering light L1 passing through the PD 51 is not reflected by the MEM light-blocking film 14 and travels through onto the MEM 59 side. Therefore, as illustrated in FIG. 7C, for example, as compared with the peak value of the sensitivity distribution in the first image-plane phase-difference detection pixel ZAF1 indicated by the broken-line curve C1, the peak value of the sensitivity distribution in the second image-plane phase-difference detection pixel ZAF102 indicated by the solid-line curve C102 is smaller, for example, by Δ. As described above, in a case where the first image-plane phase-difference detection pixel ZAF1 in which the ZAF light-blocking film 16-1 is so provided as to cover the opening 14K and the second image-plane phase-difference detection pixel ZAF2 in which the opening 14K is not shielded by the ZAF light-blocking film 16-2 are provided in a mixed manner, the obtainable phase-difference sensitivity has low symmetry. For this reason, there is a concern that the phase-difference detection characteristic is lowered.

[Effects of Solid-state Imaging Unit 101]

As described above, the solid-state imaging unit 101 of the present embodiment includes the first image-plane phase-difference detection pixel ZAF1 in which the ZAF light-blocking film 16-1 is provided in the first sub-pixel region 121 overlapping the opening 14K of the MEM light-blocking film 14. Further, in the second image-plane phase-difference detection pixel ZAF2, the ZAF light-blocking film 16-2 is provided in the second sub-pixel region 122 overlapping the opening 14K of the MEM light-blocking film 14. Therefore, for example, as compared with the case where the first image-plane phase-difference detection pixel ZAF1 in which the ZAF light-blocking film 16-1 does not overlap the opening 14K and the first image-plane phase-difference detection pixel ZAF1 in which the ZAF light-blocking film 16-2 overlaps the opening 14K are provided in a mixed manner, the variation between the detection sensitivity of the first image-plane phase-difference detection pixel ZAF1 and the detection sensitivity of the second image-plane phase-difference detection pixel ZAF2 is reduced.

Therefore, according to the solid-state imaging unit 101 of the present embodiment, the variation in detection sensitivity between the first image-plane phase-difference detection pixel ZAF1 and the second image-plane phase-difference detection pixel ZAF2 is reduced. Accordingly, it is possible to achieve a superior phase-difference detection characteristic.

2. Modifications of First Embodiment (Third Modification)
[Arrangement of Sensor Pixels 110 in Pixel Array Section 111A]

FIG. 8 is a schematic plan view of an arrangement of the sensor pixels 110 in a pixel array section 111A according to a third modification of the first embodiment.

In the pixel array section 111 of the first embodiment described above, the second image-plane phase-difference detection pixel ZAF2 is provided in the second row which is two rows away in the X-axis direction from the first row in which the first image-plane phase-difference detection pixel ZAF1 is provided. In contrast, in the pixel array section 111A according to the present modification, the second image-plane phase-difference detection pixel ZAF2 is provided in the second row adjacent to the first row in which the first image-plane phase-difference detection pixel ZAF1 is provided. It is to be noted that, also in the pixel array section 111A, the ZAF light-blocking film 16-1 and the opening 14K are provided in the first sub-pixel region 121 in the first image-plane phase-difference detection pixel ZAF1, and the ZAF light-blocking film 16-2 and the opening 14K are provided in the second sub-pixel region 122 in the second image-plane phase-difference detection pixel ZAF2. Therefore, effects similar to those of the pixel array section 111 of the first embodiment described above are expectable also with the pixel array section 111A according to the present modification.

(Fourth Modification)
[Arrangement of Sensor Pixels 110 in Pixel Array Section 111B]

FIG. 9 is a schematic plan view of an arrangement of the sensor pixels 110 in a pixel array section 111B according to a fourth modification of the first embodiment.

In the pixel array section 111 of the first embodiment described above, the first image-plane phase-difference detection pixels ZAF1 and the second image-plane phase-difference detection pixels ZAF2 are disposed at several positions where the image detection pixels 110G are to be disposed. In contrast, in the pixel array section 111B according to the present modification, the first image-plane phase-difference detection pixels ZAF1 and the second image-plane phase-difference detection pixels ZAF2 are disposed at several positions where the image detection pixels 110B are to be disposed. It is to be noted that, also in the pixel array section 111B, the ZAF light-blocking film 16-1 and the opening 14K are provided in the first sub-pixel region 121 in the first image-plane phase-difference detection pixel ZAF1, and the ZAF light-blocking film 16-2 and the opening 14K are provided in the second sub-pixel region 122 in the second image-plane phase-difference detection pixel ZAF2. Therefore, effects similar to those of the pixel array section 111 of the first embodiment described above are expectable also with the pixel array section 111B according to the present modification.

3. Second Embodiment

FIG. 10 illustrates an example of a plan configuration of a pixel array section 211 according to a second embodiment of the present technology. In the pixel array section 111 of the first embodiment described above, the ZAF light-blocking film 16-1 and the opening 14K are provided in the first sub-pixel region 121 in the first image-plane phase-difference detection pixel ZAF1, and the ZAF light-blocking film 16-2 and the opening 14K are provided in the second sub-pixel region 122 in the second image-plane phase-difference detection pixel ZAF2. In contrast, in the pixel array section 211 of the present embodiment, the ZAF light-blocking film 16-1 is provided in the first sub-pixel region 121 and the opening 14K is provided in the second sub-pixel region 122 in the first image-plane phase-difference detection pixel ZAF1. Further, in the second image-plane phase-difference detection pixel ZAF2, the ZAF light-blocking film 16-2 is provided in the second sub-pixel region 122 and the opening 14K is provided in the first sub-pixel region 121. Except for these points, the pixel array section 211 of the present embodiment has substantially the same configuration as the pixel array section 111 of the first embodiment described above.

In the pixel array section 211 of the present embodiment, the opening 14K is provided in the second sub-pixel region 122 in which the ZAF light-blocking film 16-1 is not present, in the first image-plane phase-difference detection pixel ZAF1. Therefore, a portion of entering light entering the second sub-pixel region 122 of the first image-plane phase-difference detection pixel ZAF1 passes through the opening 14K without being reflected by the MEM light-blocking film 14. For this reason, as compared with the pixel array section 111, the phase-difference sensitivity of the first image-plane phase-difference detection pixel ZAF1 is lowered. Similarly, a portion of entering light entering the first sub-pixel region 121 of the second image-plane phase-difference detection pixel ZAF2 passes through the opening 14K without being reflected by the MEM light-blocking film 14. A reason for this is that, in the pixel array section 211, the opening 14K is provided in the first sub-pixel region 121 in which the ZAF light-blocking film 16-2 is not present in the second image-plane phase-difference detection pixel ZAF2. Therefore, as compared with the pixel array section 111, the phase-difference sensitivity of the second image-plane phase-difference detection pixel ZAF2 is also lowered.

As described above, in the pixel array section 211 of the present embodiment, the opening 14K is provided in the regions in which the ZAF light-blocking film 16-1 or 16-2 is not present in both of the first image-plane phase-difference detection pixel ZAF1 and the second image-plane phase-difference detection pixel ZAF2. Therefore, as compared with the pixel array section 111 according to the first embodiment described above, both the phase-difference sensitivity of the first image-plane phase-difference detection pixel ZAF1 and the phase-difference sensitivity of the second image-plane phase-difference detection pixel ZAF2 are lowered. However, the symmetry between the distribution of the phase-difference sensitivity of the first image-plane phase-difference detection pixel ZAF1 with respect to the entering angle and the distribution of the phase-difference sensitivity of the second image-plane phase-difference detection pixel ZAF2 with respect to the entering angle is secured. Therefore, effects similar to those of the pixel array section 111 of the first embodiment described above are expectable also with the pixel array section 211 according to the present embodiment.

4. Third Embodiment

FIG. 11 illustrates an example of a cross-sectional configuration of a pixel array section 311 according to a third embodiment of the present technology. In the pixel array section 311 of the present embodiment, an additional light-blocking film 15 is further provided between the PD 51 and the MEM light-blocking film 14, as illustrated in FIG. 11. The additional light-blocking film 15 has an opening 15K at a position different from that of the opening 14K in the YX plane, i.e., in a region that does not overlap the opening 14K in the Z-axis direction. Further, the tip of the vertical trench gate 52G is separated away from the PD 51. However, because the opening 15K is provided, a transport path of electric charge from the PD 51 to the vertical trench gate 52G is secured.

In the first image-plane phase-difference detection pixel ZAF1 of the pixel array section 311, for example, the opening 14K and the additional light-blocking film 15 are present in the first sub-pixel region 121, and the opening 15K and the ZAF light-blocking film 16-1 are present in the second sub-pixel region 122. In the second image-plane phase-difference detection pixel ZAF2 of the pixel array section 311, the opening 14K and the additional light-blocking film 15 are present in the second sub-pixel region 122, and the opening 15K and the ZAF light-blocking film 16-2 are present in the first sub-pixel region 121. Therefore, variation between the detection sensitivity of the first image-plane phase-difference detection pixel ZAF1 and the detection sensitivity of the second image-plane phase-difference detection pixel ZAF2 is reduced.

Accordingly, it is possible to achieve a superior phase-difference detection characteristic also in a solid-state imaging unit including the pixel array section 311 of the present embodiment.

5. Example of Application to Electronic Apparatus

FIG. 12 is a block diagram illustrating an example of a configuration of a camera 2000 which is an electronic apparatus to which the present technology is applied.

The camera 2000 includes: an optical unit 2001 including a lens group and the like; an imaging unit (an imaging device) 2002 to which the above-described solid-state imaging unit 101 or the like (hereinafter referred to as the solid-state imaging unit 101 or the like) is applied; and a DSP (Digital Signal Processor) circuit 2003 which is a camera signal processing circuit. The camera 2000 further includes a frame memory 2004, a display 2005, a recording unit 2006, an operation unit 2007, and a power source unit 2008. The DSP circuit 2003, the frame memory 2004, the display 2005, the recording unit 2006, the operation unit 2007, and the power source unit 2008 are coupled to each other via a bus line 2009.

The optical unit 2001 takes in entering light (image light) from a subject and forms an image on an imaging plane of the imaging unit 2002. The imaging unit 2002 converts a light amount of the entering light, which is formed into the image on the imaging plane by the optical unit 2001, into an electric signal on a pixel-unit basis, and outputs the electric signal as a pixel signal.

The display 2005 includes, for example, a panel display device such as a liquid crystal panel or an organic EL panel. The display 2005 displays, for example, a moving image or a still image captured by the imaging unit 2002. The recording unit 2006 records the moving image or the still image captured by the imaging unit 2002 in a recording medium such as a hard disk or a semiconductor memory.

The operation unit 2007 outputs an operation command regarding a variety of functions of the camera 2000 under operation by a user. The power source unit 2008 appropriately supplies a variety of power sources to serve as respective operation power sources for the DSP circuit 2003, the frame memory 2004, the display 2005, the recording unit 2006, and the operation unit 2007, to these targets of supply.

As described above, the use of the above-described solid-state imaging unit 101 or the like as the imaging unit 2002 leads to an expectation of acquiring a favorable image.

6. Example of Practical Application to Mobile Body

The technology (the present technology) according to the present disclosure is applicable to a variety of products. For example, the technology according to the present disclosure may be achieved as a unit mounted on any type of mobile body such as an automobile, an electric automobile, a hybrid electric automobile, a motorcycle, a bicycle, a personal mobility, an airplane, a drone, a vessel, or a robot.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the forgoing, described is one example of the vehicle control system to which the technology according to the present disclosure is applicable. The technology according to the present disclosure is applicable to the imaging section 12031 among the above-described components. Specifically, the solid-state imaging unit 101A illustrated in FIG. 1, etc. or the like is applicable to the imaging section 12031. The application of the technology according to the present disclosure to the imaging section 12031 leads to an expectation of superior operation of the vehicle control system.

7. Other Modifications

Although the present disclosure has been described above with reference to some embodiments and modifications, the present disclosure is not limited to the embodiments etc. described above, and is modifiable in a variety of ways. For example, in the embodiments etc. described above, the pixel region 120 includes the first sub-pixel region 121 and the second sub-pixel region 122 which are adjacent to each other in one direction (the Y-axis direction) in a divided manner. However, the present disclosure is not limited thereto. For example, as a pixel array section 411 according to a modification of the present disclosure illustrated in FIG. 15, the sensor pixel 110 having the pixel region 120 including a third sub-pixel region 123 and a fourth sub-pixel region 124 adjacent to each other in the X-axis direction in a divided manner may also be provided in a mixed manner. In the pixel array section 411, a third image-plane phase-difference detection pixel ZAF3 and a fourth image-plane phase-difference detection pixel ZAF4 allow for detection of a phase-difference signal in the X-axis direction. In the third image-plane phase-difference detection pixel ZAF3, for example, the opening 14K and a ZAF light-blocking film 16-3 are provided in the third sub-pixel region 123. Further, in the fourth image-plane phase-difference detection pixel ZAF4, the opening 14K and a ZAF light-blocking film 16-4 are provided in the fourth sub-pixel region 124. Variation between detection sensitivity of the third image-plane phase-difference detection pixel ZAF3 and detection sensitivity of the fourth image-plane phase-difference detection pixel ZAF4 is reduced also in the pixel array section 411 having such a configuration. Therefore, it is possible to achieve a superior phase-difference detection characteristic also in the solid-state imaging unit including this pixel array section 411.

Moreover, the imaging unit of the present disclosure is not limited to an imaging unit that detects a light amount distribution of visible light and acquires it as an image, and may be an imaging unit that acquires a distribution of an entering amount of infrared rays, X-rays, particles, or the like as an image.

Moreover, the imaging unit of the present disclosure may also be in a form of a module in which an imaging section and a signal processor or an optical system are packaged together.

According to the imaging unit and the electronic apparatus of embodiments of the present disclosure, variation in detection sensitivity between two or more image-plane phase-difference detection pixels is reduced. Therefore, it is possible to achieve a superior phase-difference detection characteristic. It is to be noted that effects of the present disclosure are not limited thereto, and may be any of the effects described below. Moreover, the present technology may be configured as follows.

(1)
An imaging unit including:
two or more image-plane phase-difference detection pixels each including
a semiconductor layer that includes a front surface and a back surface on an opposite side to the front surface,
a photoelectric converter that is provided in the semiconductor layer, and is configured to generate electric charge corresponding to a light reception amount by photoelectric conversion,
a charge holding section that is provided between the front surface and the photoelectric converter in the semiconductor layer, and is configured to hold the electric charge,
a first light-blocking film that is positioned between the photoelectric converter and the charge holding section, and has an opening through which the electric charge is allowed to pass, and
a second light-blocking film that is positioned on an opposite side to the first light-blocking film as viewed from the photoelectric converter, in which
all of the second light-blocking films of the two or more respective image-plane phase-difference detection pixels are provided in respective first regions, or are provided in respective second regions, the first regions each including an overlapping region that is a region overlapping the opening in a pixel region occupied by the photoelectric converter, the second regions each being a region other than the first region in the pixel region.

(2)

The imaging unit according to (1) described above, in which
  the pixel region includes a first sub-pixel region and a second sub-pixel region that are adjacent to each other in a first direction in a divided manner, and
  the two or more image-plane phase-difference detection pixels include
    a first image-plane phase-difference detection pixel that includes the second light-blocking film provided in the first sub-pixel region, and
    a second image-plane phase-difference detection pixel that includes the second light-blocking film provided in the second sub-pixel region.

(3)

The imaging unit according to (1) or (2) described above, further including a charge transfer section that includes a vertical trench gate extending from a front surface side toward the charge holding section through the opening.

(4)

The imaging unit according to any one of (1) to (3) described above, in which the opening is provided at a position other than center in the pixel region.

(5)

The imaging unit according to any one of (1) to (4) described above, further including
  two or more imaging pixels that are arranged in a first direction and a second direction, in which
  the two or more image-plane phase-difference detection pixels are disposed among the two or more imaging pixels in each of the first direction and the second direction.

(6)

The imaging unit according to (5) described above, in which
  the two or more imaging pixels further include two or more first to third imaging pixels, the first to the third imaging pixels respectively including first to third color filters, the first to the third imaging pixels being cyclically arranged in each of the first direction and the second direction, and
  the image-plane phase-difference detection pixels are each disposed at any of two or more first positions to replace any one of the two or more first imaging pixels, the two or more first positions being positions at which the two or more respective first imaging pixels are to be disposed.

(7)

An electronic apparatus including an imaging unit,
  the imaging unit including
  two or more image-plane phase-difference detection pixels each including
    a semiconductor layer that includes a front surface and a back surface on an opposite side to the front surface,
    a photoelectric converter that is provided in the semiconductor layer, and is configured to generate electric charge corresponding to a light reception amount by photoelectric conversion,
    a charge holding section that is provided between the front surface and the photoelectric converter in the semiconductor layer, and is configured to hold the electric charge,
    a first light-blocking film that is positioned between the photoelectric converter and the charge holding section, and has an opening through which the electric charge is allowed to pass, and
    a second light-blocking film that is positioned on an opposite side to the first light-blocking film as viewed from the photoelectric converter, in which
  all of the second light-blocking films of the two or more respective image-plane phase-difference detection pixels are provided in respective first regions, or are provided in respective second regions, the first regions each including an overlapping region that is a region overlapping the opening in a pixel region occupied by the photoelectric converter, the second regions each being a region other than the first region in the pixel region.

This application claims the benefit of Japanese Priority Patent Application JP2019-56165 filed with the Japan Patent Office on Mar. 25, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging unit, comprising:
  two or more image-plane phase-difference detection pixels each including:
    a semiconductor layer that includes a front surface and a back surface on an opposite side to the front surface,
    a photoelectric converter that is in the semiconductor layer, and is configured to generate electric charge corresponding to a light reception amount by photoelectric conversion,
    a charge holding section that is between the front surface and the photoelectric converter in the semiconductor layer, and is configured to hold the electric charge,
    a first light-blocking film that is positioned between the photoelectric converter and the charge holding section, and has an opening through which the electric charge is allowed to pass, and
    a second light-blocking film that is positioned on an opposite side to the first light-blocking film as viewed from the photoelectric converter, wherein
  the second light-blocking film of each of the two or more image-plane phase-difference detection pixels are in respective first regions, or are in respective second regions, the first regions each including an overlapping region that is a region overlapping the opening in a pixel region occupied by the photoelectric converter, the second regions being a region other than the first regions in the pixel region.

2. The imaging unit according to claim 1, wherein
  the pixel region includes a first sub-pixel region and a second sub-pixel region that are adjacent to each other in a first direction in a divided manner, and
  the two or more image-plane phase-difference detection pixels include
    a first image-plane phase-difference detection pixel that includes the second light-blocking film in the first sub-pixel region, and
    a second image-plane phase-difference detection pixel that includes the second light-blocking film in the second sub-pixel region.

3. The imaging unit according to claim 1, further comprising a charge transfer section that includes a vertical trench gate extending from a front surface side toward the charge holding section through the opening.

4. The imaging unit according to claim 1, wherein the opening is at a position other than center in the pixel region.

5. The imaging unit according to claim 1, further comprising
two or more imaging pixels that are arranged in a first direction and a second direction, wherein
the two or more image-plane phase-difference detection pixels are disposed among the two or more imaging pixels in each of the first direction and the second direction.

6. The imaging unit according to claim 5, wherein
the two or more imaging pixels further include two or more first to third imaging pixels, the first to the third imaging pixels respectively including first to third color filters, the first to the third imaging pixels being cyclically arranged in each of the first direction and the second direction, and
the image-plane phase-difference detection pixels are each disposed at any of two or more first positions to replace any one of the two or more first imaging pixels, the two or more first positions being positions at which the two or more respective first imaging pixels are to be disposed.

7. An electronic apparatus comprising an imaging unit, the imaging unit including
two or more image-plane phase-difference detection pixels, wherein each of the two or more image-plane phase-difference detection pixels includes:
  a semiconductor layer that includes a front surface and a back surface on an opposite side to the front surface,
  a photoelectric converter that is in the semiconductor layer, and is configured to generate electric charge corresponding to a light reception amount by photoelectric conversion,
  a charge holding section that is between the front surface and the photoelectric converter in the semiconductor layer, and is configured to hold the electric charge,
  a first light-blocking film that is positioned between the photoelectric converter and the charge holding section, and has an opening through which the electric charge is allowed to pass, and
  a second light-blocking film that is positioned on an opposite side to the first light-blocking film as viewed from the photoelectric converter, wherein
the second light-blocking film of each of the two or more image-plane phase-difference detection pixels are in respective first regions, or are in respective second regions, the first regions each including an overlapping region that is a region overlapping the opening in a pixel region occupied by the photoelectric converter, the second regions being a region other than the first regions in the pixel region.

\* \* \* \* \*